(12) United States Patent
Liu

(10) Patent No.: US 12,324,140 B2
(45) Date of Patent: Jun. 3, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLOGY, INC., Hefei (CN)

(*) Notice: Subject to any disclaimer, the term of this patent is extended or adjusted under 35 U.S.C. 154(b) by 492 days.

(21) Appl. No.: 17/661,237

(22) Filed: Apr. 28, 2022

(65) Prior Publication Data

US 2023/0068654 A1 Mar. 2, 2023

(30) Foreign Application Priority Data

Aug. 27, 2021 (CN) .......................... 202110997638.7

(51) Int. Cl.
*H10B 12/00* (2023.01)
*H01L 21/311* (2006.01)
*H01L 21/768* (2006.01)

(52) U.S. Cl.
CPC .... *H10B 12/0335* (2023.02); *H01L 21/31144* (2013.01); *H01L 21/76802* (2013.01); *H10B 12/31* (2023.02); *H01L 21/31116* (2013.01); *H10B 12/34* (2023.02)

(58) Field of Classification Search
CPC .... H10B 12/0335; H10B 12/31; H10B 12/34; H10B 12/315; H01L 21/31144; H01L 21/76802; H01L 21/31116; H01L 28/90
See application file for complete search history.

(56) References Cited

U.S. PATENT DOCUMENTS

| | | | |
|---|---|---|---|
| 10,169,521 B2 | 1/2019 | Wang et al. | |
| 10,354,876 B1 | 7/2019 | Chang et al. | |
| 10,734,390 B1* | 8/2020 | Park | H10B 12/482 |
| 2016/0020213 A1* | 1/2016 | Kim | H10B 12/34 |
| | | | 438/618 |
| 2023/0053461 A1* | 2/2023 | Liu | H10B 12/00 |

FOREIGN PATENT DOCUMENTS

| | | |
|---|---|---|
| CN | 108573079 A | 9/2018 |
| CN | 110534525 A | 12/2019 |

\* cited by examiner

*Primary Examiner* — Joseph C. Nicely
*Assistant Examiner* — Alvin L Lee
(74) *Attorney, Agent, or Firm* — Syncoda LLC; Feng Ma

(57) ABSTRACT

The present disclosure provides a semiconductor structure and a manufacturing method thereof. The manufacturing method of the semiconductor structure includes: forming a first patterned mask layer on an upper surface of a first filling dielectric layer, the first patterned mask layer including a plurality of pattern units; etching the first filling dielectric layer based on the first patterned mask layer to form etched recesses; forming a second filling dielectric layer, the second filling dielectric layer filling up the etched recesses and covering the first patterned mask layer; removing the first patterned mask layer, and parts of the second filling dielectric layer on the first patterned mask layer and between the pattern units; removing the remaining first filling dielectric layer to form a plurality of capacitor contact holes exposing the substrate; and forming, in the capacitor contact holes, capacitor contact structures located on the two opposite sides of the BLs.

15 Claims, 45 Drawing Sheets

SEMICONDUCTOR STRUCTURE AND MANUFACTURING METHOD THEREOF

CROSS-REFERENCE TO RELATED APPLICATIONS

This application claims the priority of Chinese Patent Application No. 202110997638.7, submitted to the Chinese Intellectual Property Office on Aug. 27, 2021, the disclosure of which is incorporated herein in its entirety by reference.

TECHNICAL FIELD

The present disclose relates to the field of integrated circuit (IC) manufacturing, and in particular to a semiconductor structure and a manufacturing method thereof.

BACKGROUND

With the rapid development of semiconductor storage technologies, devices are getting smaller and are being arranged more densely, which has brought greater challenges to manufacturing processes. For a dynamic random access memory (DRAM), storage node contacts (SNCs) each include a bottom connected to a substrate and a shallow trench isolation (STI) structure, and a top connected to a bottom electrode plate of a memory capacitor, thus implementing the electrical connection between the transistor and the memory capacitor.

While the devices are getting smaller, there is a more serious overlapping problem between SNCs and active areas in the substrate. The parasitic capacitance of bit lines (BLs) on the substrate mainly depends on contact areas between the SNCs and the bit lines. In order to reduce the parasitic capacitance of the BLs, the SNCs are usually made as small as possible. With the decreased areas of the SNCs, the parasitic capacitance is reduced, but the contact areas between the SNCs and the active areas are also decreased to degrade performance of the semiconductor devices.

SUMMARY

A first aspect of the present application provides a manufacturing method of a semiconductor structure, including:
providing a substrate, the substrate being provided with spaced active areas therein and a plurality of parallel spaced bit lines (BLs) thereon;
forming a first filling dielectric layer, the first filling dielectric layer filling up gaps between adjacent BLs and covering tops of the BLs;
forming a first patterned mask layer on an upper surface of the first filling dielectric layer, the first patterned mask layer including a plurality of pattern units, and orthographic projection of each of the pattern units on the substrate being stretched across one of the BLs and partially located on two opposite sides of the one of the BLs;
etching the first filling dielectric layer based on the first patterned mask layer to form etched recesses, the etched recesses exposing the substrate;
forming a second filling dielectric layer, the second filling dielectric layer filling up the etched recesses and covering the first patterned mask layer;
removing the first patterned mask layer, and parts of the second filling dielectric layer on the first patterned mask layer and between the pattern units;
removing the remaining first filling dielectric layer to form a plurality of capacitor contact holes, the capacitor contact holes exposing the substrate, and the capacitor contact holes each including a first sub-contact-hole and a second sub-contact-hole on the two opposite sides of each of the BLs; and
forming capacitor contact structures in the capacitor contact holes, the capacitor contact structures each including a first sub-contact-structure corresponding to the first sub-contact-hole and a second sub-contact-structure corresponding to the second sub-contact-hole.

A second aspect of the present application provides a semiconductor structure, including:
a substrate, the substrate being provided with spaced active areas therein and a plurality of parallel spaced BLs thereon;
a filling dielectric layer, located between adjacent BLs; and
capacitor contact structures, located in the filling dielectric layer, the capacitor contact structures each including a first sub-contact-structure and a second sub-contact-structure, and the first sub-contact-structure and the second sub-contact-structure being located on two opposite sides of each of the BLs.

BRIEF DESCRIPTION OF THE DRAWINGS

To describe the technical solutions in the embodiments of the present application more clearly, the accompanying drawings required to describe the embodiments are briefly described below. Apparently, the accompanying drawings described below are only some embodiments of the present application. Those of ordinary skill in the art may further obtain accompanying drawings of other embodiments based on these accompanying drawings without creative efforts.

FIG. 2b is a stereoscopic view of a semiconductor structure along an AA' direction in FIG. 2a. FIG. 2d is a partial cross-sectional view along an AA' direction in FIG. 2a.

FIG. 3b is a partially enlarged view of a C region in FIG. 3a. FIG. 3c is a partial cross-sectional view along a BB' direction in FIG. 2a.

FIG. 4b is a stereoscopic view along a BB' direction in FIG. 2a. FIG. 4c is a partial cross-sectional view along a BB' direction in FIG. 2a.

FIG. 5b is a stereoscopic view along a BB' direction in FIG. 2a. FIG. 5c is a partial cross-sectional view along a BB' direction in FIG. 2a.

FIG. 6b is a partial cross-sectional view along a BB' direction in FIG. 2a.

FIG. 7b is a stereoscopic view along a BB' direction in FIG. 2a. FIG. 7c is a partial cross-sectional view along a BB' direction in FIG. 2a.

FIG. 8b is a stereoscopic view along a BB' direction in FIG. 2a. FIG. 8c is a partial cross-sectional view along a BB' direction in FIG. 2a.

FIG. 9b is a partial cross-sectional view along a BB' direction in FIG. 2a.

FIG. 10b is a stereoscopic view along a BB' direction in FIG. 2a. FIG. 10c is a partial cross-sectional view along a BB' direction in FIG. 2a.

FIG. 11b is a stereoscopic view along a BB' direction in FIG. 2a. FIG. 11c is a partial cross-sectional view along a BB' direction in FIG. 2a.

FIG. 12b is a partial cross-sectional view along a BB' direction in FIG. 2a.

FIG. 13b is a stereoscopic view along a BB' direction in FIG. 2a. FIG. 13c is a partial cross-sectional view along a BB' direction in FIG. 2a.

FIG. 14b is a partial cross-sectional view along a BB' direction in FIG. 2a.

FIG. 15b is a partial cross-sectional view along a BB' direction in FIG. 2a.

FIG. 16b is a partial cross-sectional view along a BB' direction in FIG. 2a.

FIG. 17b is a stereoscopic view along a BB' direction in FIG. 2a. FIG. 17c is a partial cross-sectional view along a BB' direction in FIG. 2a.

DETAILED DESCRIPTION

Figure 1:
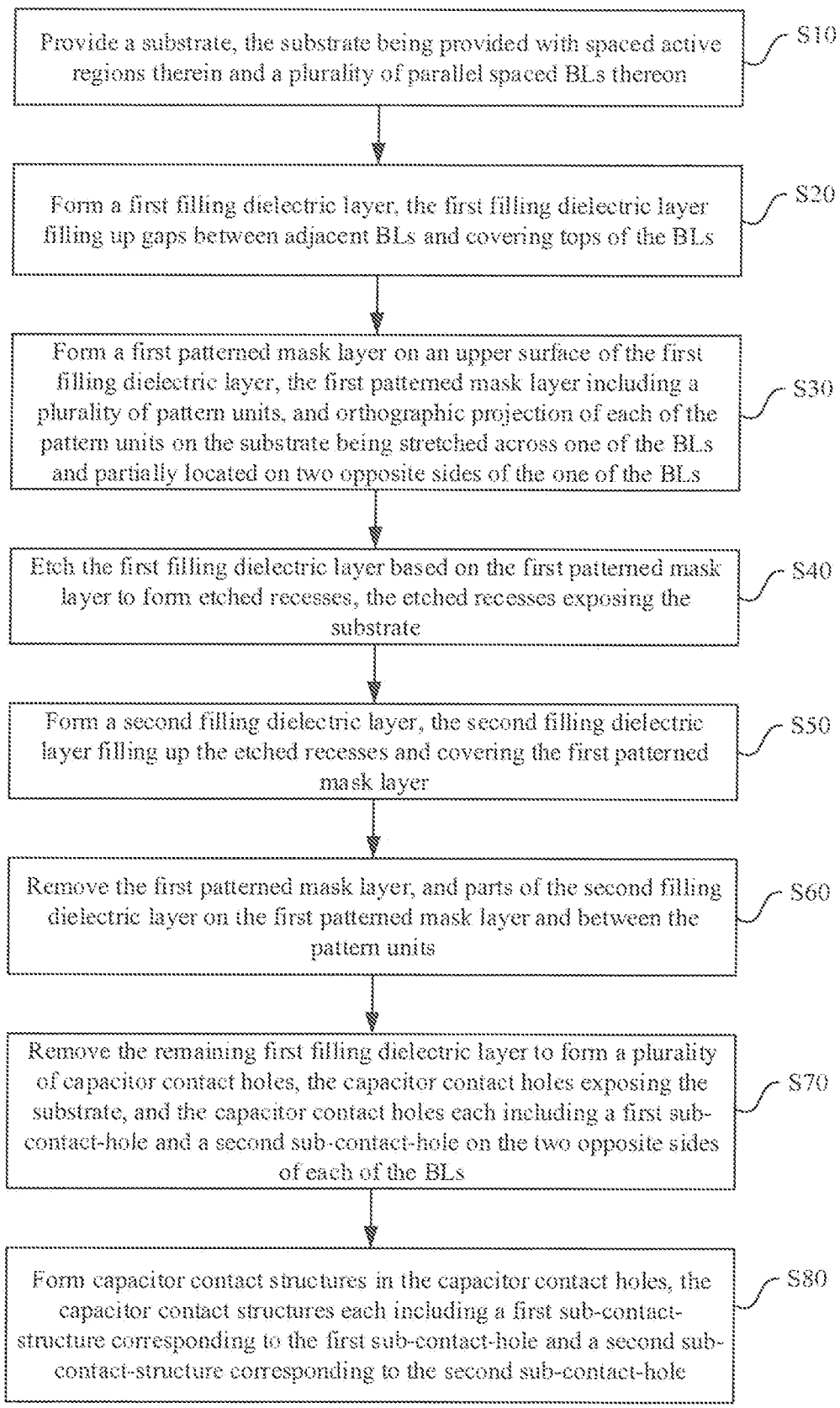
FIG. 1 is a schematic flowchart of a manufacturing method of a semiconductor structure according to an embodiment of the present application.

In order to facilitate the understanding of the present application, the present application is described more completely below with reference to the drawings. The preferred embodiments of this application are given in the accompanying drawings. However, the present application may be embodied in various forms without being limited to the embodiments described herein. On the contrary, these embodiments are provided, so that the disclosure of this application is more thoroughly and comprehensively.

Unless otherwise defined, all technical and scientific terms used herein have the same meaning as commonly understood by those skilled in the technical field of the present application. The terms mentioned herein are merely for the purpose of describing specific embodiments, rather than to limit the present application. The term "and/or" used herein includes any and all combinations of one or more of the associated listed items.

It should be understood that when an element or layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teachings of the present application, the first element, component, region, layer or section discussed below may a second element, component, region, layer or section.

Spatial relationship terms such as "under", "beneath", "lower", "below", "above", and "upper" can be used herein to conveniently describe the relationship shown in the figure between one element or feature and another element or feature. It should be understood that in addition to the orientations shown in the figure, the spatial relationship terms are intended to further include different orientations of used and operated devices. For example, if a device in the accompanying drawings is turned over, and then described as being "beneath another element", "below it", or "under it", the device or feature is oriented "on" the another element or feature. Therefore, the exemplary terms "beneath" and "under" may include two orientations of above and below. The device may be otherwise oriented (rotated by 90 degrees or other orientations), and the spatial description used herein is interpreted accordingly.

The embodiments of the present application are described herein with reference to cross-sectional views as schematic diagrams of the embodiments and intermediate structures of the present application. In this way, changes from the shown shape due to, for example, the manufacturing technology and/or tolerances can be expected. Therefore, the embodiments of the present application should not be limited to the specific shapes of the regions shown herein, but include shape deviations due to, for example, manufacturing. The regions shown in the figure are schematic in nature, and their shapes are not intended to show the actual shapes of the regions of the device and limit the scope of the present application.

Self-aligned double patterning (SADP) is used in nowadays to manufacture SNCs. During manufacturing, pattern units extending in a same direction as gate word lines (WLs) are formed, and constituted into a plurality of checkerboard capacitor contact holes with BLs. The SNCs are of a square shape, fill the capacitor contact holes and are located between the pattern units and the BLs. However, bottom active areas are guided sideward, and contact areas between the SNCs and the active areas are decreased. Conventionally, large SNCs are manufactured to ensure large contact areas between the SNCs and the active areas. As a result, there are large invalid areas of the SNCs and large parasitic capacitance of the BLs. Therefore, the present application provides a novel semiconductor structure. The half-moon shaped SNCs are located on two opposite sides of the BLs and always keep large effective contact areas with the active areas, such that the performance of the semiconductor structure is improved, and the parasitic capacitance between the BLs and the capacitor contact structures is reduced. Furthermore, while the devices are getting smaller, the effective contact areas of the SNCs are increased to solve the increasingly serious overlapping problems between the SNCs and the active areas in the substrate.

As shown in FIG. 1, an embodiment of the present application provides a manufacturing method of a semiconductor structure, including the following steps:

Step S10: Provide a substrate, the substrate being provided with spaced active areas therein and a plurality of parallel spaced BLs thereon.

Step S20: Form a first filling dielectric layer, the first filling dielectric layer filling up gaps between adjacent BLs and covering tops of the BLs.

Step S30: Form a first patterned mask layer on an upper surface of the first filling dielectric layer, the first patterned mask layer including a plurality of pattern units, and orthographic projection of each of the pattern units on the substrate being stretched across one of the BLs and partially located on two opposite sides of the one of the BLs.

Step S40: Etch the first filling dielectric layer based on the first patterned mask layer to form etched recesses, the etched recesses exposing the substrate.

Step S50: Form a second filling dielectric layer, the second filling dielectric layer filling up the etched recesses and covering the first patterned mask layer.

Step S60: Remove the first patterned mask layer, and parts of the second filling dielectric layer on the first patterned mask layer and between the pattern units.

Step S70: Remove the remaining first filling dielectric layer to form a plurality of capacitor contact holes, the capacitor contact holes exposing the substrate, and the capacitor contact holes each including a first sub-contact-hole and a second sub-contact-hole on the two opposite sides of each of the BLs.

Step S80: Form capacitor contact structures in the capacitor contact holes, the capacitor contact structures each including a first sub-contact-structure corresponding to the first sub-contact-hole and a second sub-contact-structure corresponding to the second sub-contact-hole.

Based on the pattern units stretched across the two opposite sides of the BLs, the present application forms the capacitor contact structures on the two opposite sides of the BLs through steps such as masking, etching and filling. Different from conventional capacitor contact structures between the pattern units and the BLs, the novel capacitor contact structures always keep large effective contact areas with the active areas while the size of the semiconductor structure is decreased, which greatly reduces the parasitic capacitance between the BLs and the capacitor contact structures, improves the performance of the semiconductor structure, and solves the increasingly serious overlapping problem between the capacitor contact structures and the active areas in the substrate.

Figure 2A:
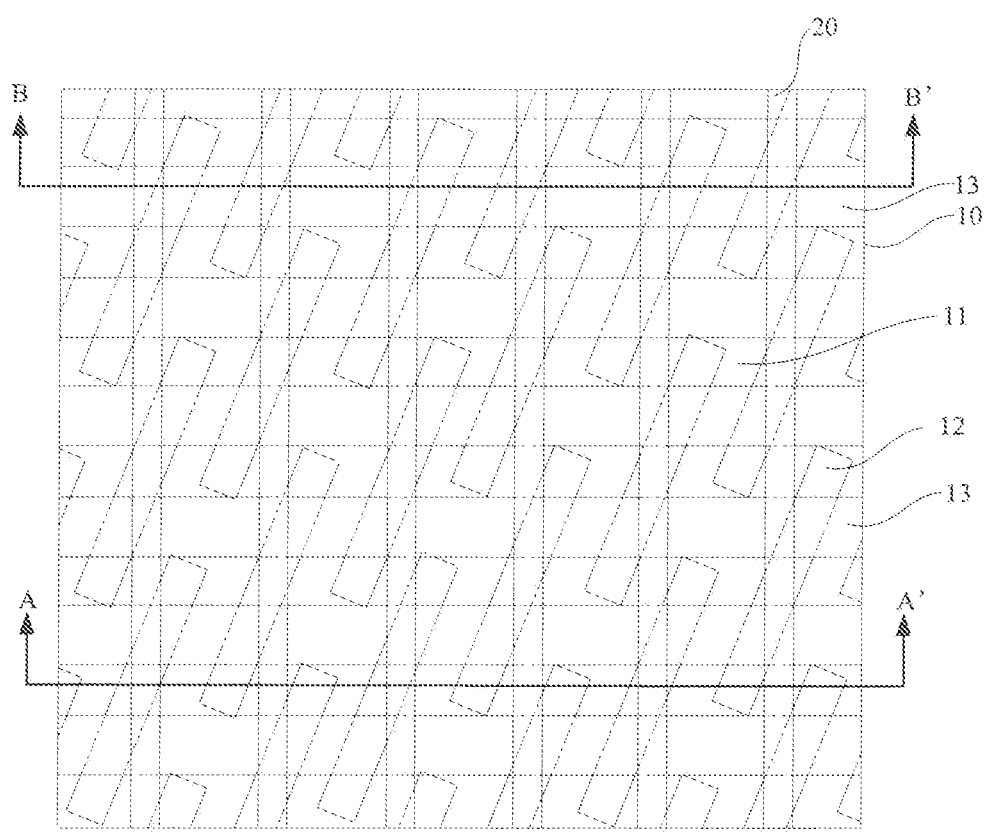
FIG. 2a is a top view of a semiconductor structure according to an embodiment of the present application.
Figure 2B:
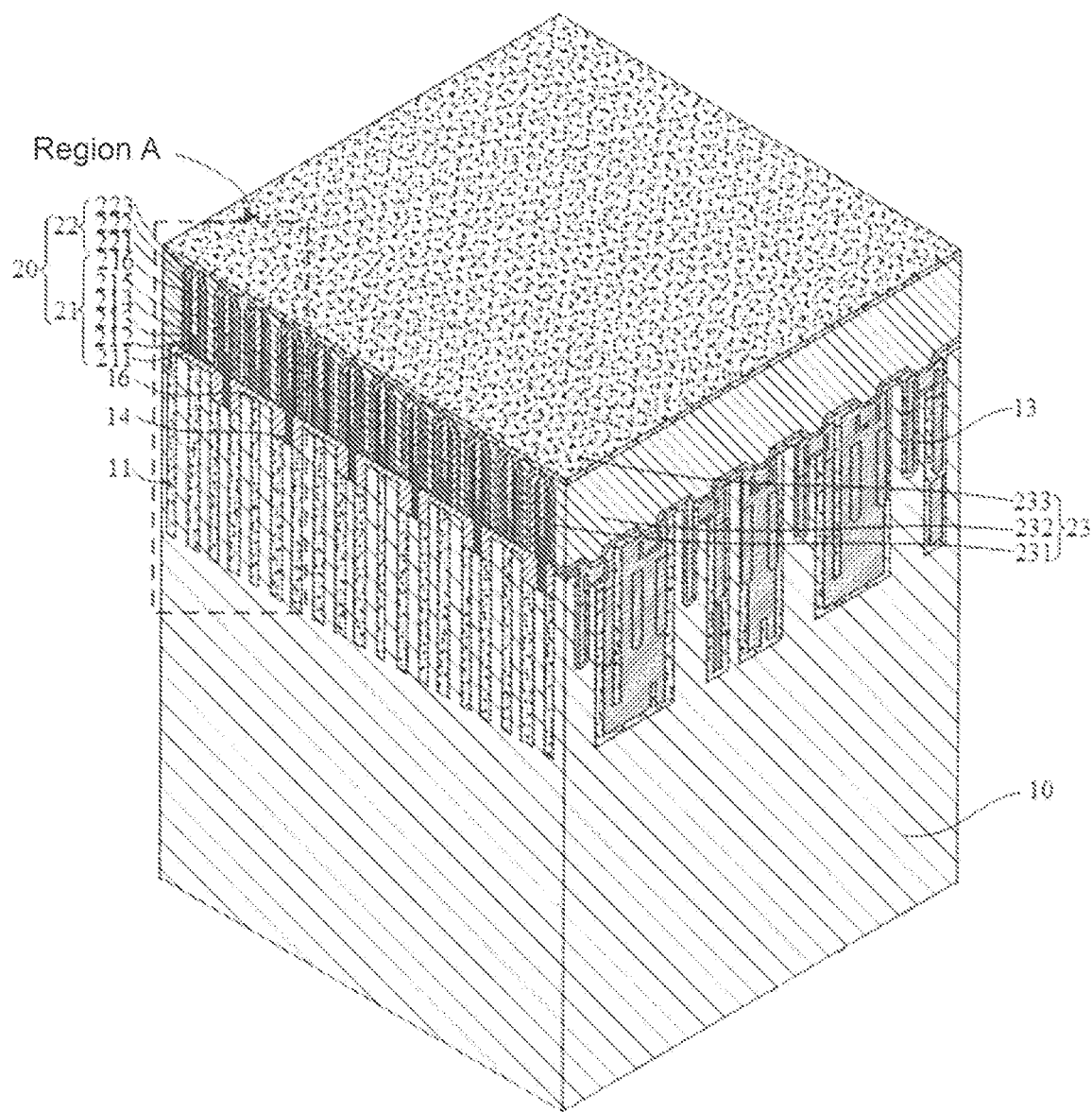
Figure 2C:
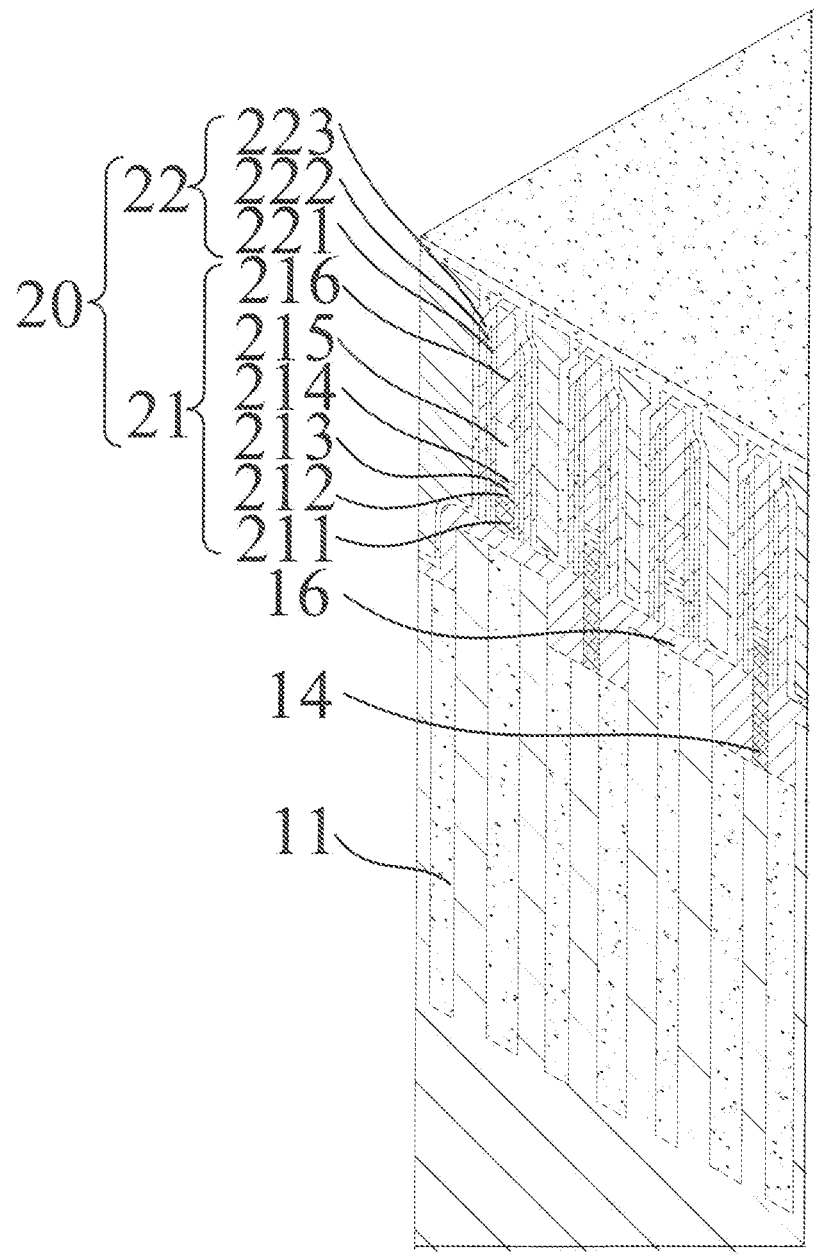
FIG. 2c is a partially enlarged view of a region A in FIG. 2b.

In an embodiment, as shown in FIG. 2a, the substrate 10 provided in Step S10 includes, but is not limited to, a silicon substrate. Shallow trench isolation (STI) structures 11 are formed in the substrate 10. The STI structures 11 isolate, in the substrate 10, a plurality of active areas 12 arranged in an array. An implantation (IMP) technology is used to implant ions into each of the active areas 12 to form a source and a drain (not shown in FIG. 2a). A plurality of parallel spaced embedded gate WLs 13 are further formed in the substrate 10, and an extension direction of the embedded gate WLs 13 is intersected with an extension direction of the BLs 20 and an extension direction of the active areas 12.

As an example, as shown in FIG. 2b, FIG. 2c, FIG. 2d and FIG. 2e, a capping dielectric layer 16 is further formed on an upper surface of the substrate 10. The capping dielectric layer 16 is made of a material including but not limited to $Si_3N_4$ or $SiO_2$. At least one of the BLs 20 is formed on an upper surface of the capping dielectric layer 16. An insulating dielectric layer 15 is further provided between the BLs 20 and the STI structures 11. The insulating dielectric layer 15 includes a first insulating dielectric layer 151 and a second insulating dielectric layer 152. The second insulating dielectric layer 152 is located in the first insulating dielectric layer 151. The second insulating dielectric layer 152 contacts the substrate 10, the STI structures 11 and the capping dielectric layer 16.

As an example, the BLs 20 each include a sub-bitline 21 and a BL isolation structure 22 on a sidewall of the sub-bitline 21. The sub-bitline 21 includes an intrinsic polycrystalline silicon layer 211, a first BL conductive layer 212, a second BL conductive layer 213, a third BL conductive layer 214, a fourth BL conductive layer 215 and a sub-bitline dielectric layer 216 that are stacked sequentially from the bottom up. A BL contact structure 14 is further provided between the substrate 10 and the sub-bitline 21. The BL contact structure 14 is located between the first BL conductive layer 212 and the substrate 10. The BL contact structure 14 includes, but is not limited to, a doped polycrystalline silicon layer. The first BL conductive layer 212 is made of a material including but not limited to Ti. The second BL conductive layer 213 is made of a material including but not limited to TSN. The third BL conductive layer 214 is made of a material including but not limited to WSi. The fourth BL conductive layer 215 is made of a material including but not limited to W. The sub-bitline dielectric layer 216 is made of a material including but not limited to $Si_3N_4$, and may be manufactured with low-pressure chemical vapor deposition (LPCVD).

As an example, the BL isolation structure 22 includes a first isolation dielectric layer 221, a second isolation dielectric layer 222 and a third isolation dielectric layer 223 that are arranged sequentially outward from the sub-bitline 21. The BL isolation structure 22 may be of a $Si_3N_4$—$SiO_2$—$Si_3N_4$ structure, namely an "NON" sandwich structure, and may also be of an "ONO" structure. In the BL isolation structure 22, there may be a sandwich structure stacked sequentially outward from the sub-bitline 21, and the first isolation dielectric layer 221 may also contact the third isolation dielectric layer 223. The case where a top of the first isolation dielectric layer 221 contacts a top of the second isolation dielectric layer 222 is used as an example in the embodiment, FIG. 2b and FIG. 2c. Both the first isolation dielectric layer 221 and the third isolation dielectric layer 223 may be made of a material including but not limited to $Si_3N_4$, and may be manufactured with atomic layer deposition (ALD).

Figure 2D:
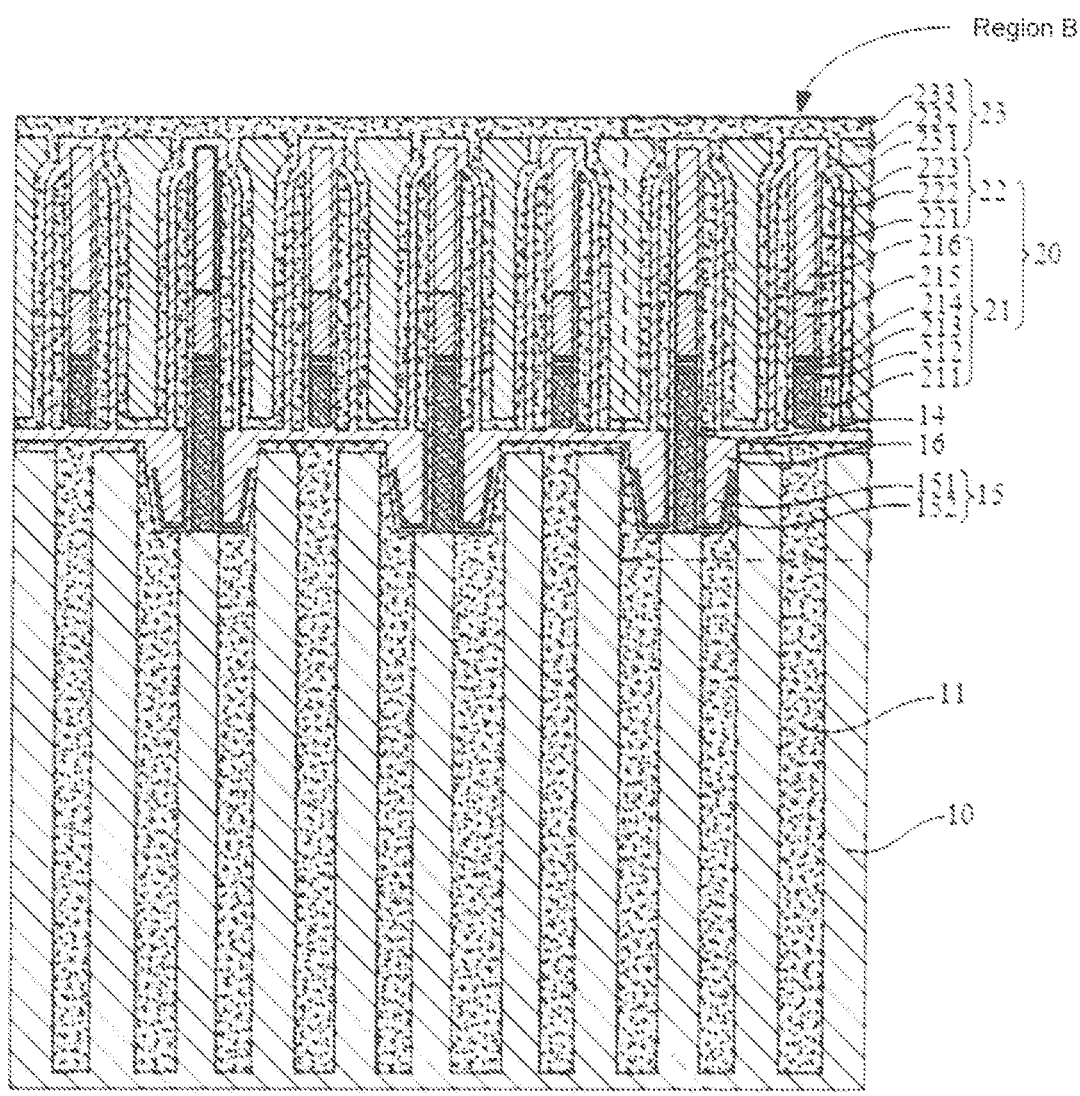
Figure 2E:
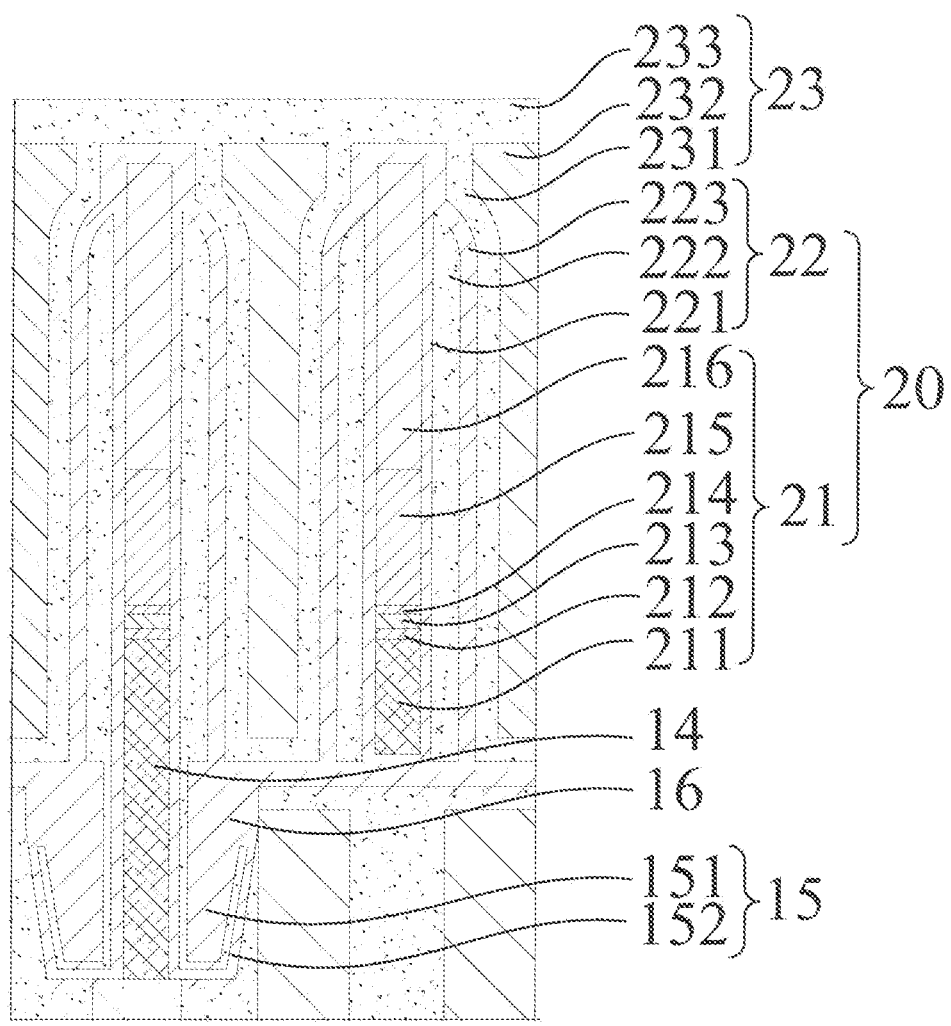
FIG. 2e is a partially enlarged view of a region B in FIG. 2d.

In an embodiment, referring also to FIG. 2d and FIG. 2e, the first filling dielectric layer 23 formed in Step S20 includes a first filling dielectric sub-layer 231, a second filling dielectric sub-layer 232 and a third filling dielectric sub-layer 233. The first filling dielectric sub-layer 231 covers a sidewall of the BL isolation structure 22. The second filling dielectric sub-layer 232 fills up the gaps between adjacent BLs 20. The third filling dielectric sub-layer 233 covers tops of the BLs 20, the first filling dielectric sub-layer 231 and the second filling dielectric sub-layer 232. Both the first filling dielectric sub-layer 231 and the third filling dielectric sub-layer 233 are made of a material including but not limited to SiO$_2$, and may be manufactured with tetraethyl orthosilicate (TEOS), low-temperature oxidation (LTO) or the ALD. The second filling dielectric sub-layer 232 is made of a material including but not limited to spin on dielectrics (SOD).

Figure 3A:
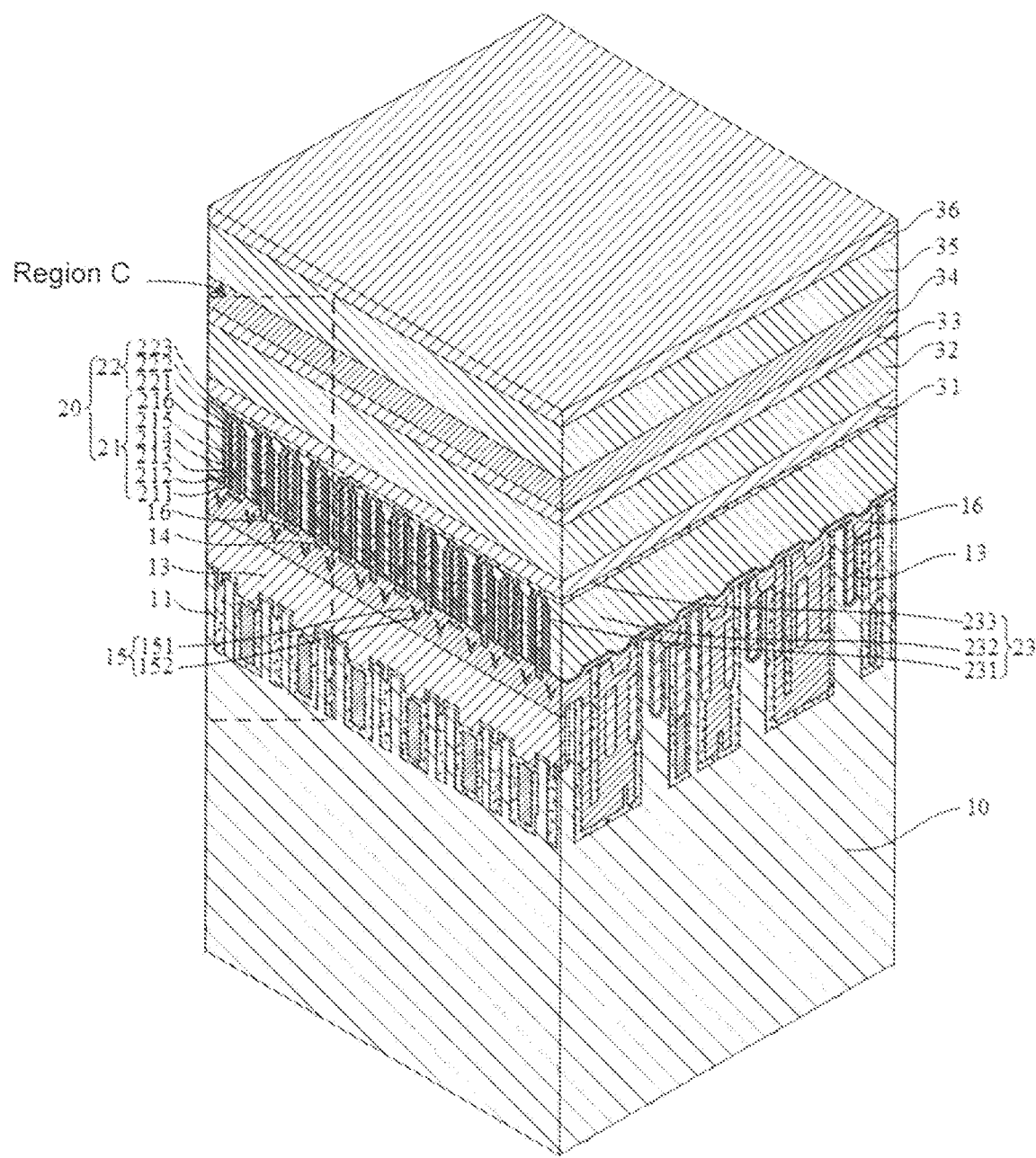
FIG. 3a is a stereoscopic view of a structure along a BB' direction in FIG. 2a after formation of a first mask dielectric layer, a first HM layer, a second mask dielectric layer, a third mask dielectric layer, a second HM layer and a fourth mask dielectric layer according to an embodiment of the present application.
Figure 3B:
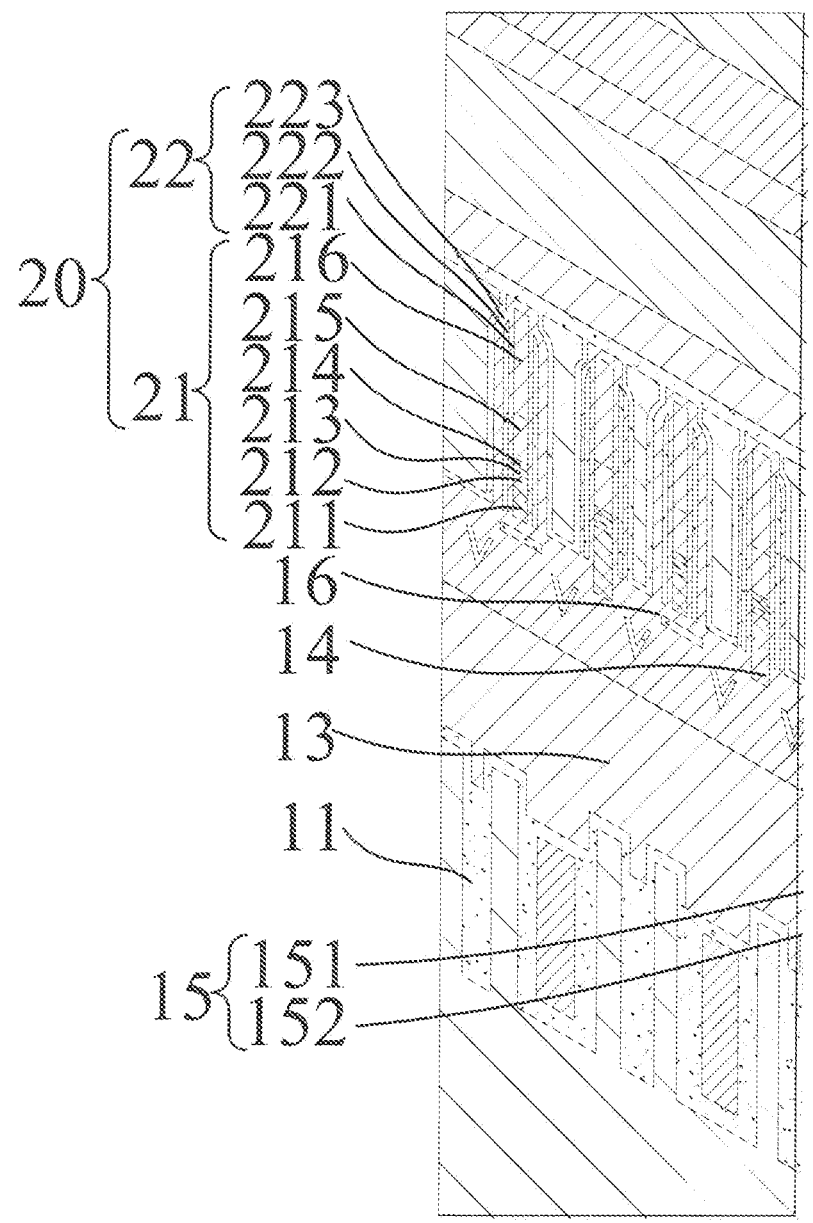
Figure 3C:
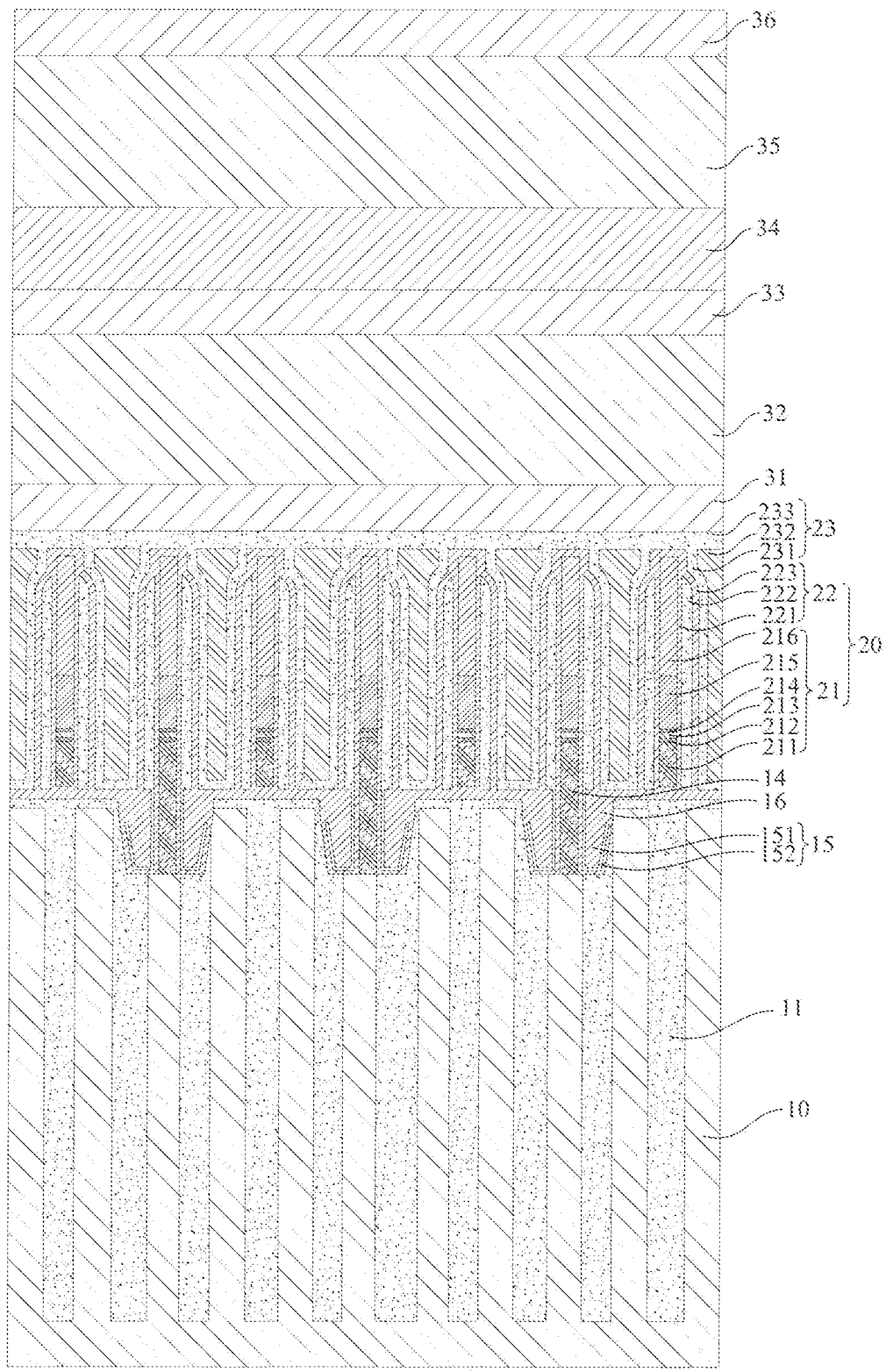

In an embodiment, Step S30 of forming a first patterned mask layer on an upper surface of the first filling dielectric layer includes the following steps:

Step S301: Form, on the upper surface of the first filling dielectric layer 23, a first mask dielectric layer 31, a first HM layer 32, a second mask dielectric layer 33, a third mask dielectric layer 34, a second hard mask (HM) layer 35 and a fourth mask dielectric layer 36 that are stacked sequentially from the bottom up, as shown in FIG. 3a, FIG. 3b and FIG. 3c.

Figure 4A:
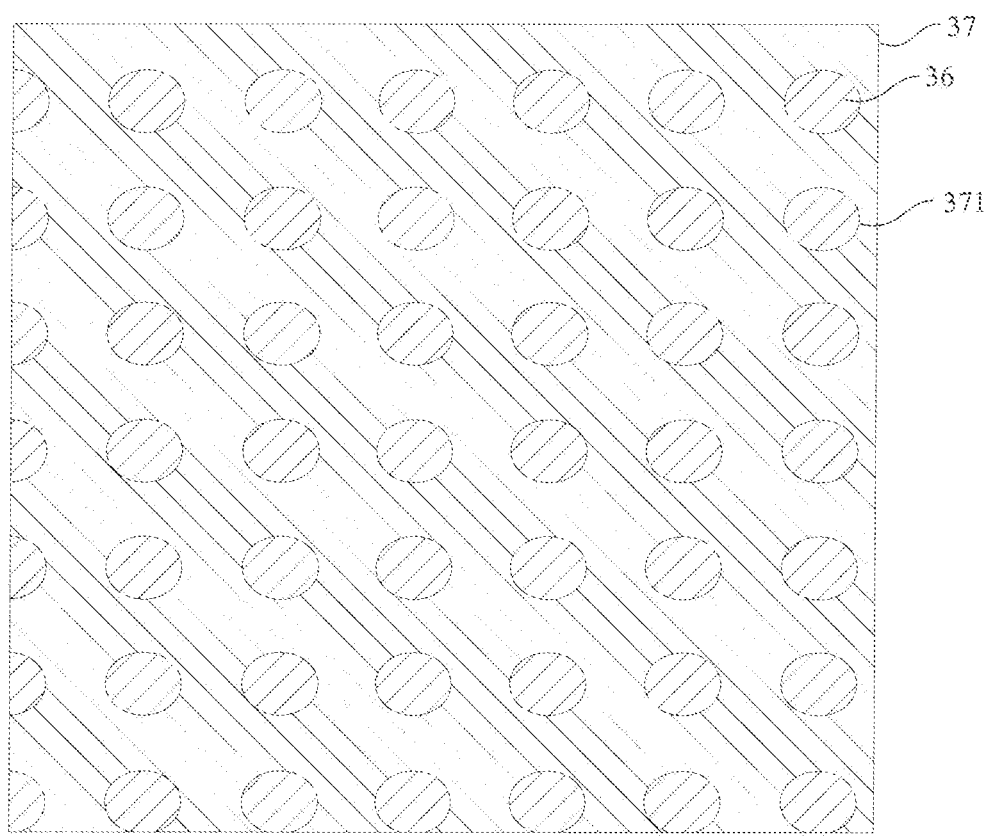
FIG. 4a is a top view of a structure after formation of a second patterned mask layer according to an embodiment of the present application.
Figure 4B:
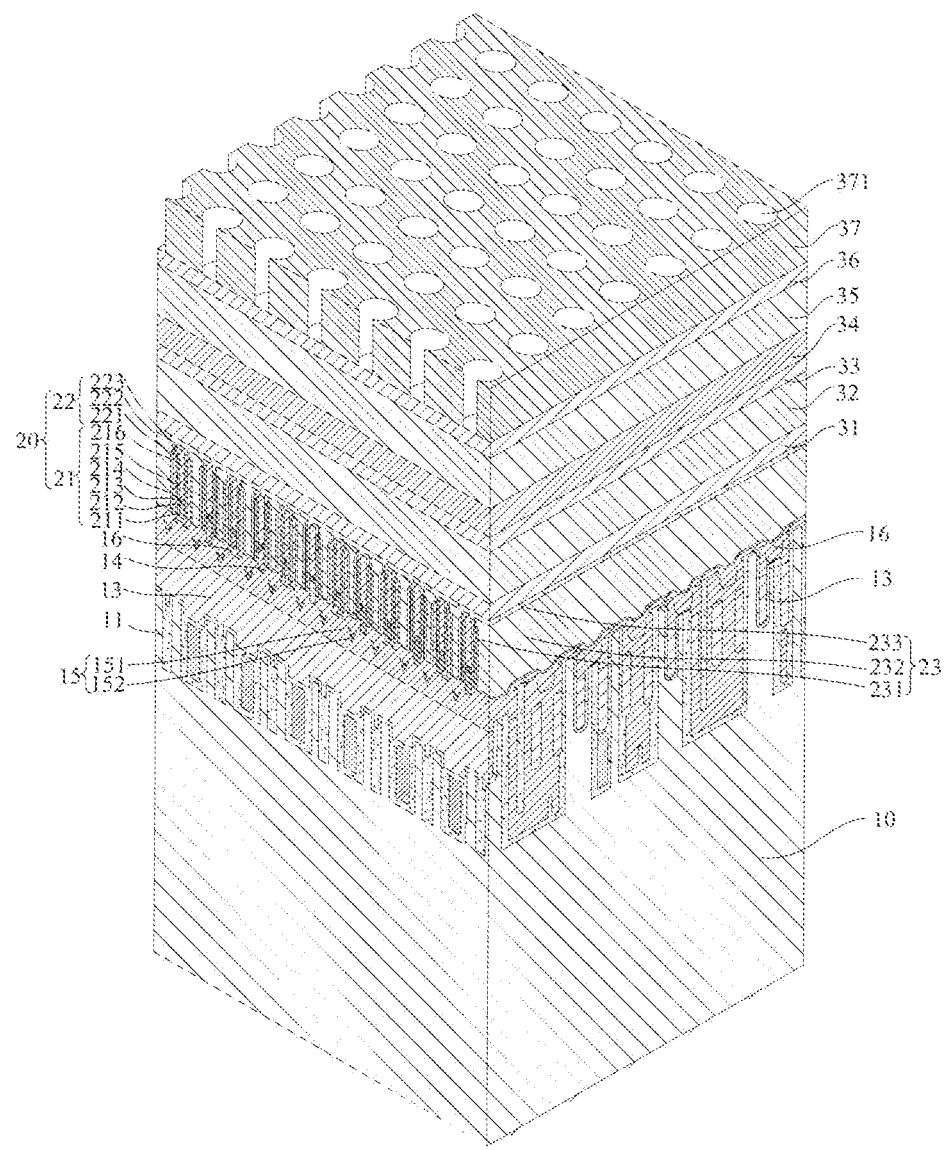
Figure 4C:
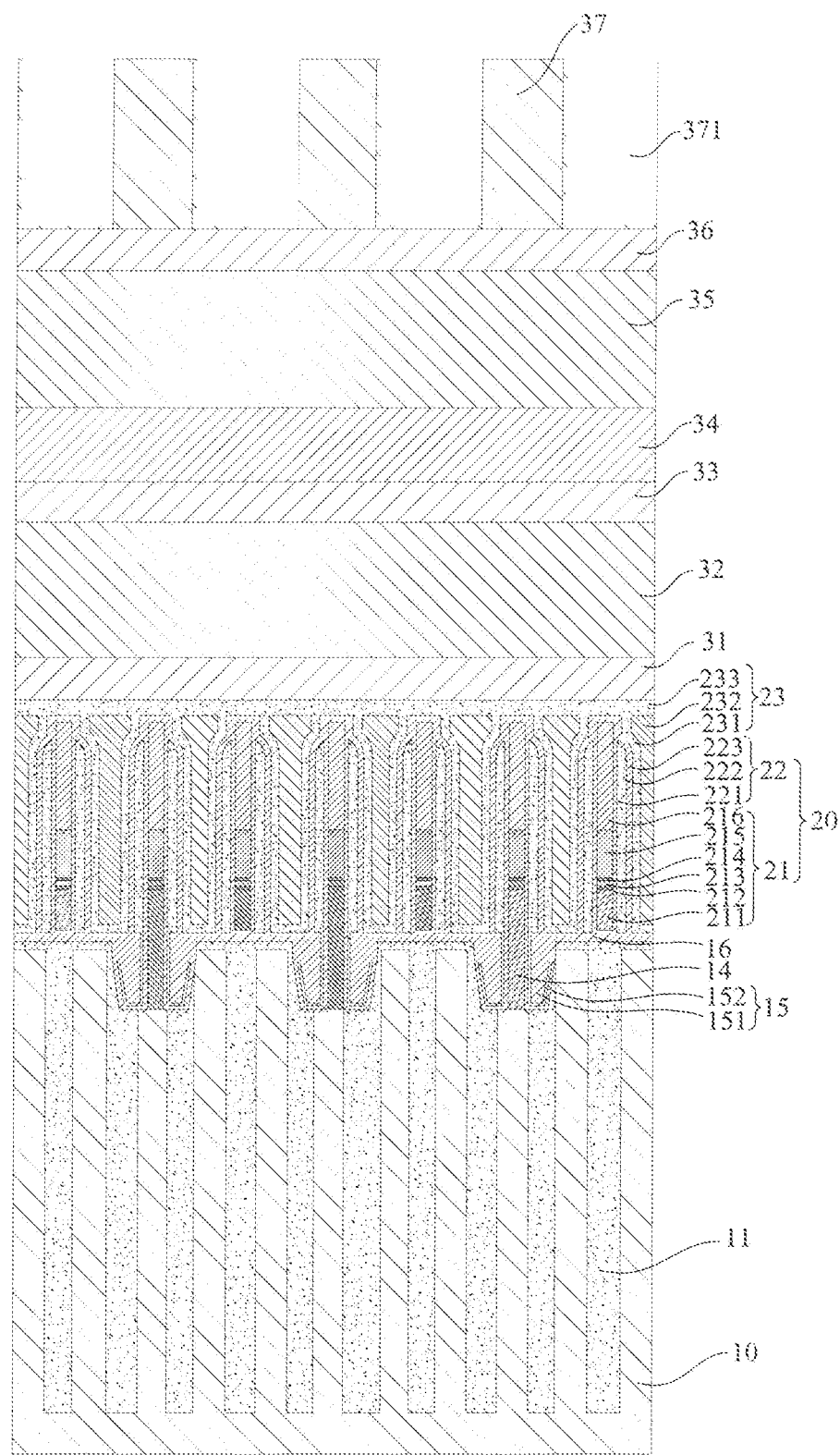

Step S302: Form a second patterned mask layer 37 on an upper surface of the fourth mask dielectric layer 36, a plurality of first opening patterns 371 arranged in rows and columns being formed in the second patterned mask layer 37, as shown in FIG. 4a, FIG. 4b and FIG. 4c.

Figure 5A:
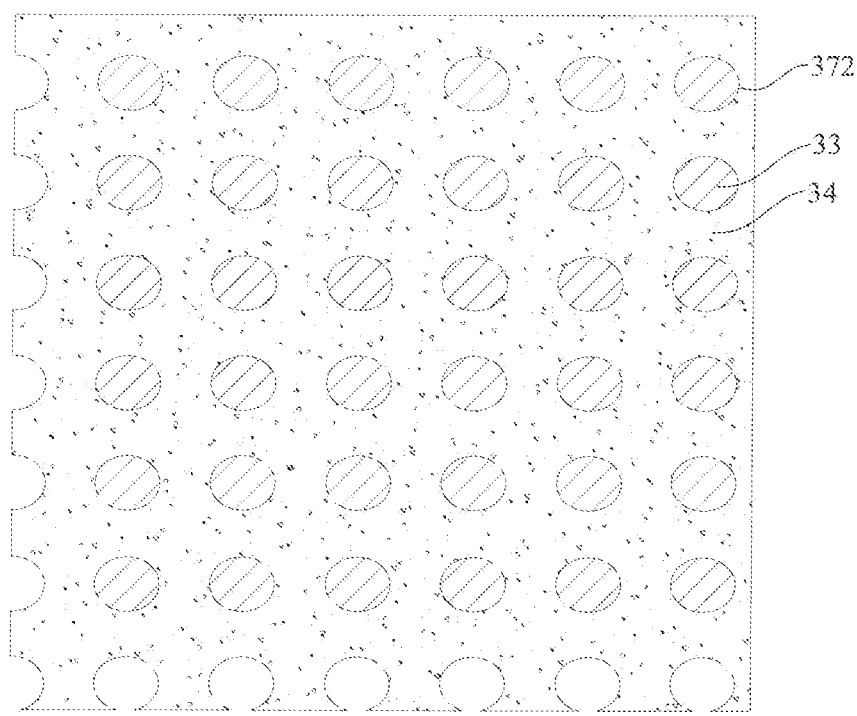
FIG. 5a is a top view of second opening patterns in a third mask dielectric layer according to an embodiment of the present application.
Figure 5B:
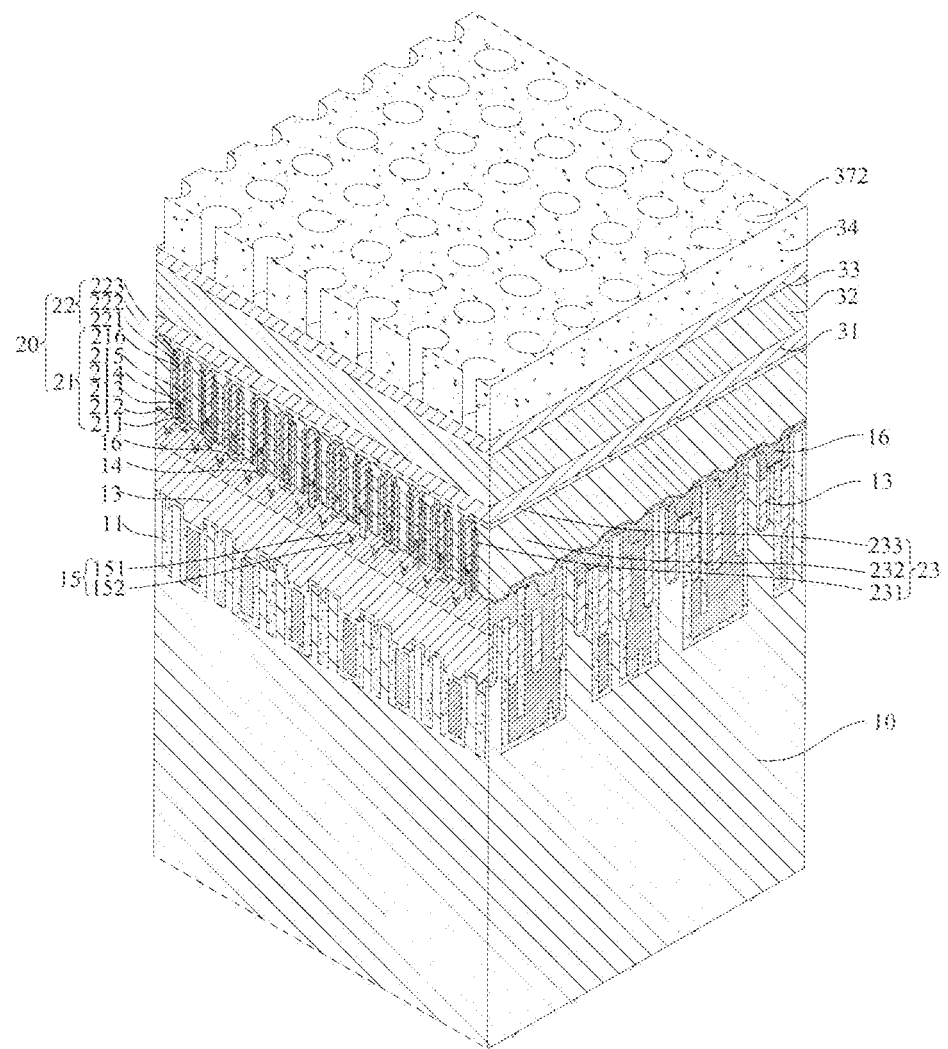
Figure 5C:
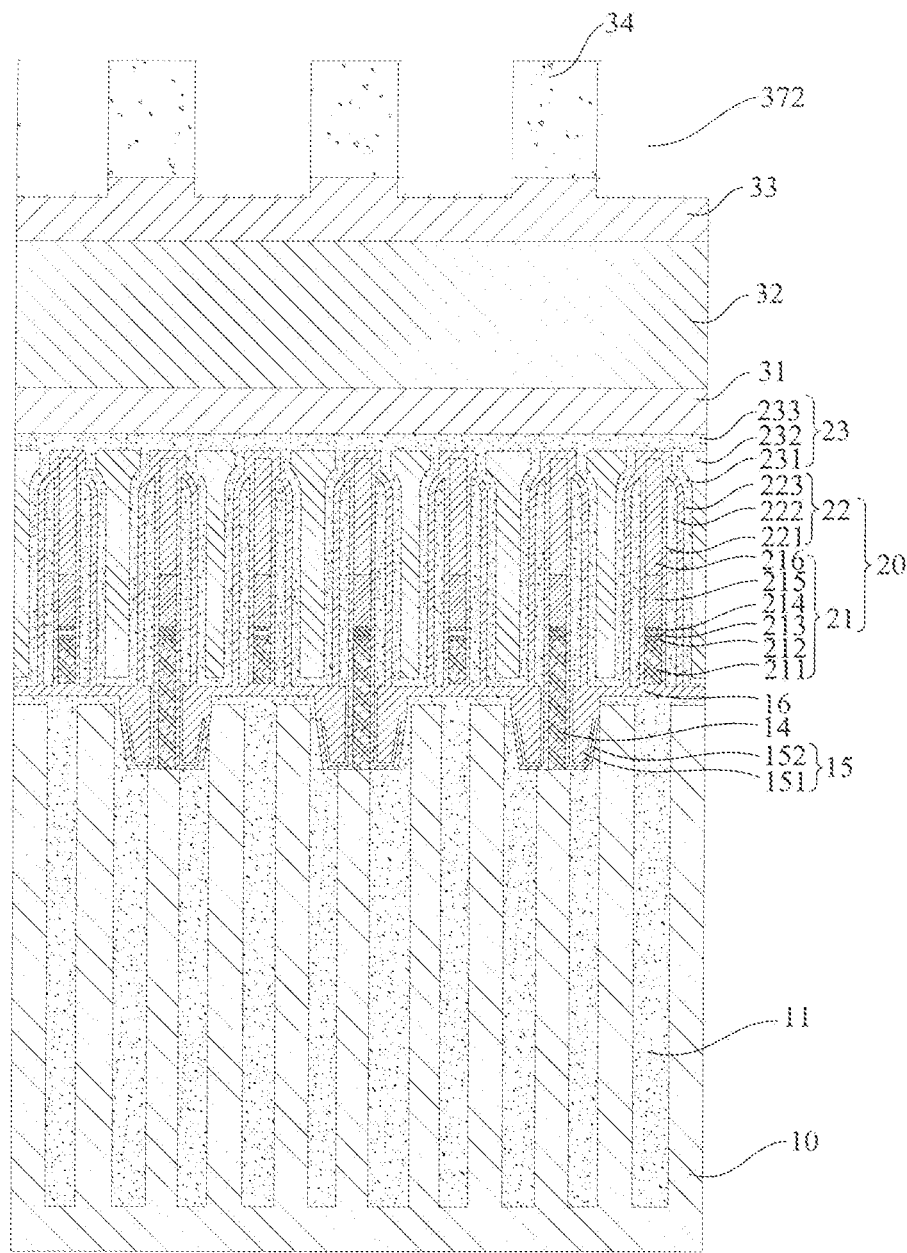

Step S303: Etch the fourth mask dielectric layer 36 and the second HM layer 35 based on the second patterned mask layer 37, and perform first etching on the third mask dielectric layer 34 to form second opening patterns 372 corresponding to the first opening patterns 371 in the third mask dielectric layer 34, as shown in FIG. 5a, FIG. 5b and FIG. 5c.

Step S304: Remove the second patterned mask layer 37, the fourth mask dielectric layer 36 and the second HM layer 35, as shown in FIG. 5b and FIG. 5c.

Figure 6A:
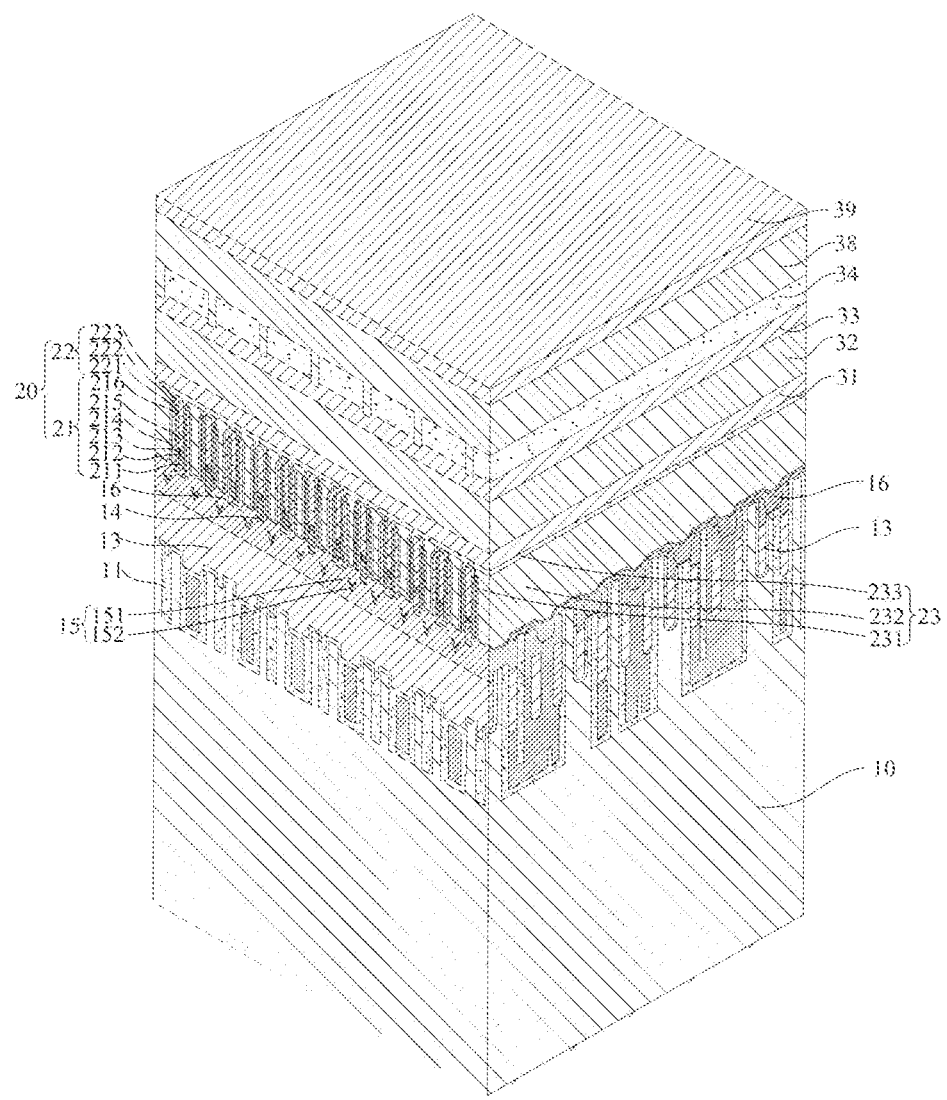
FIG. 6a is a stereoscopic view of a structure along a BB' direction in FIG. 2a after formation of a third HM layer and a fifth mask dielectric layer according to an embodiment of the present application.
Figure 6B:
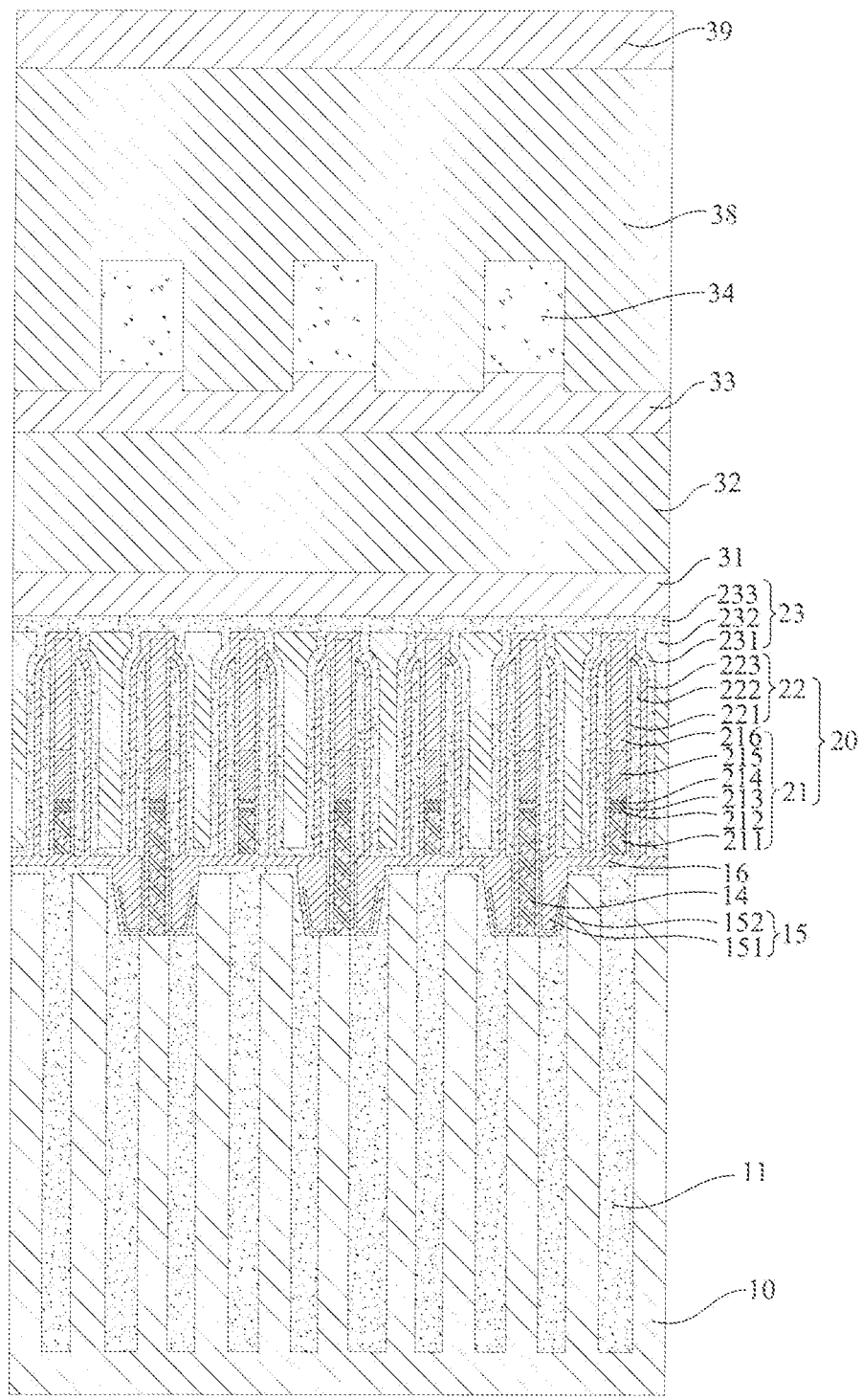

Step S305: Form a third HM layer 38 and a fifth mask dielectric layer 39 that are stacked sequentially from the bottom up, the third HM layer 38 filling up the second opening patterns 372 and covering the third mask dielectric layer 34 subjected to the first etching, as shown in FIG. 6a and FIG. 6b.

Figure 7A:
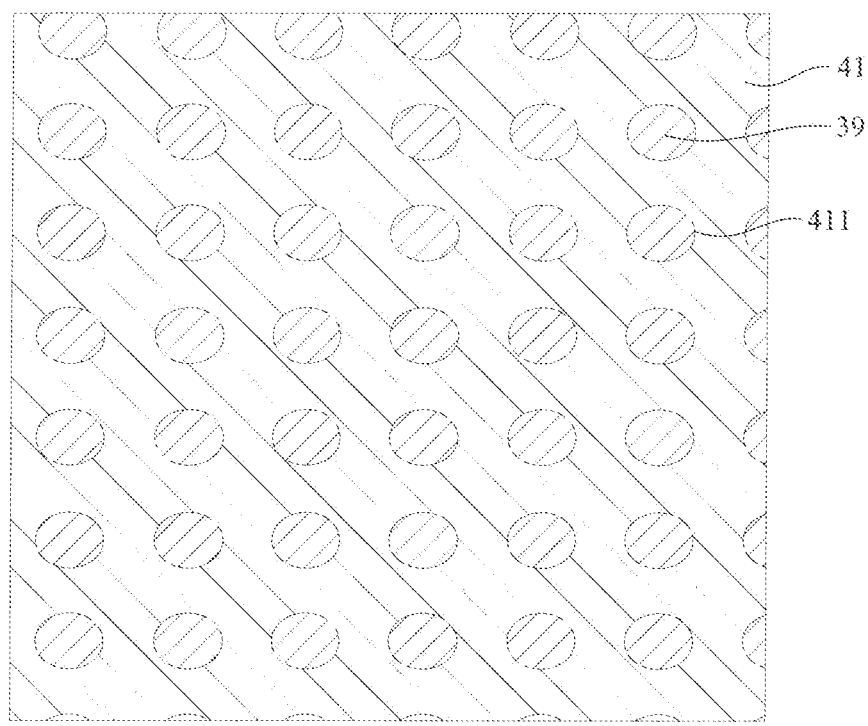
FIG. 7a is a top view of a third patterned mask layer according to an embodiment of the present application.
Figure 7B:
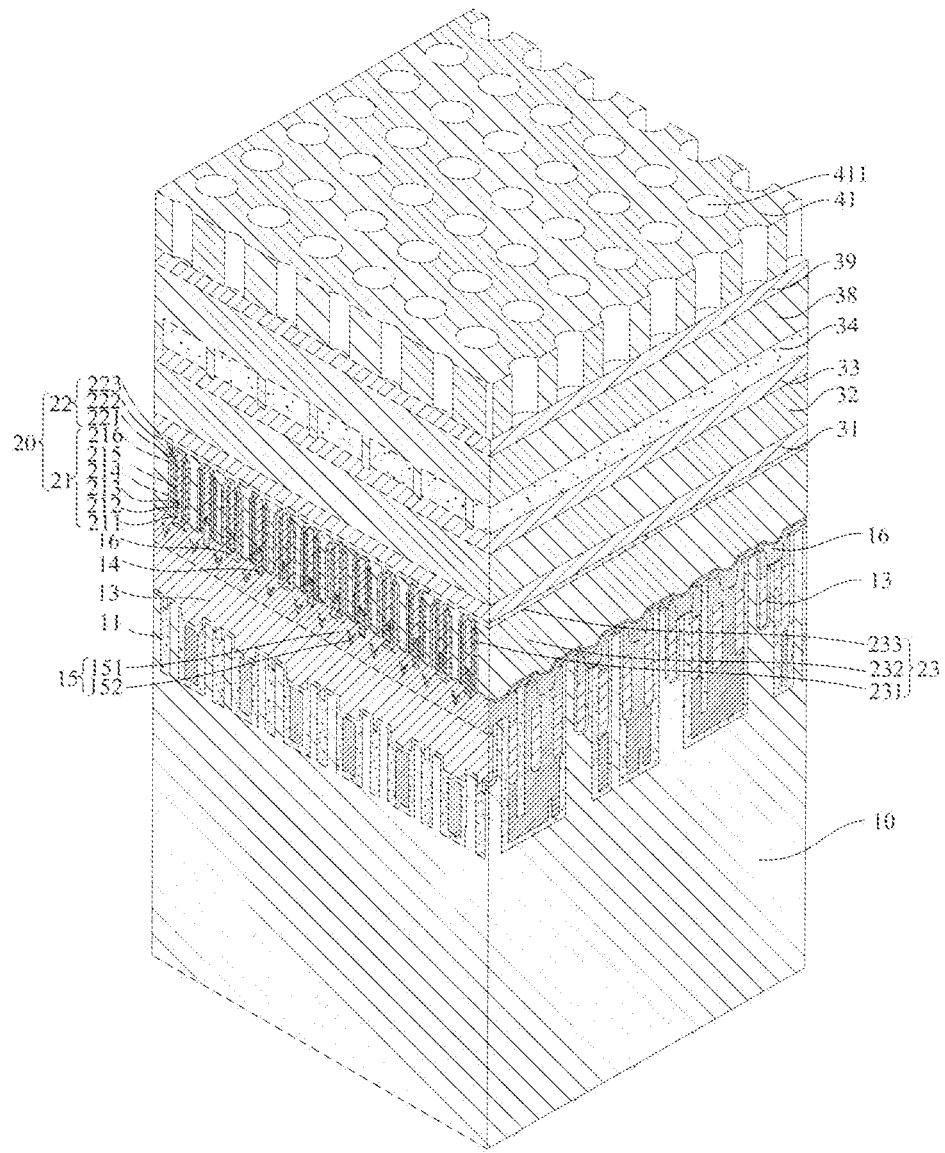
Figure 7C:
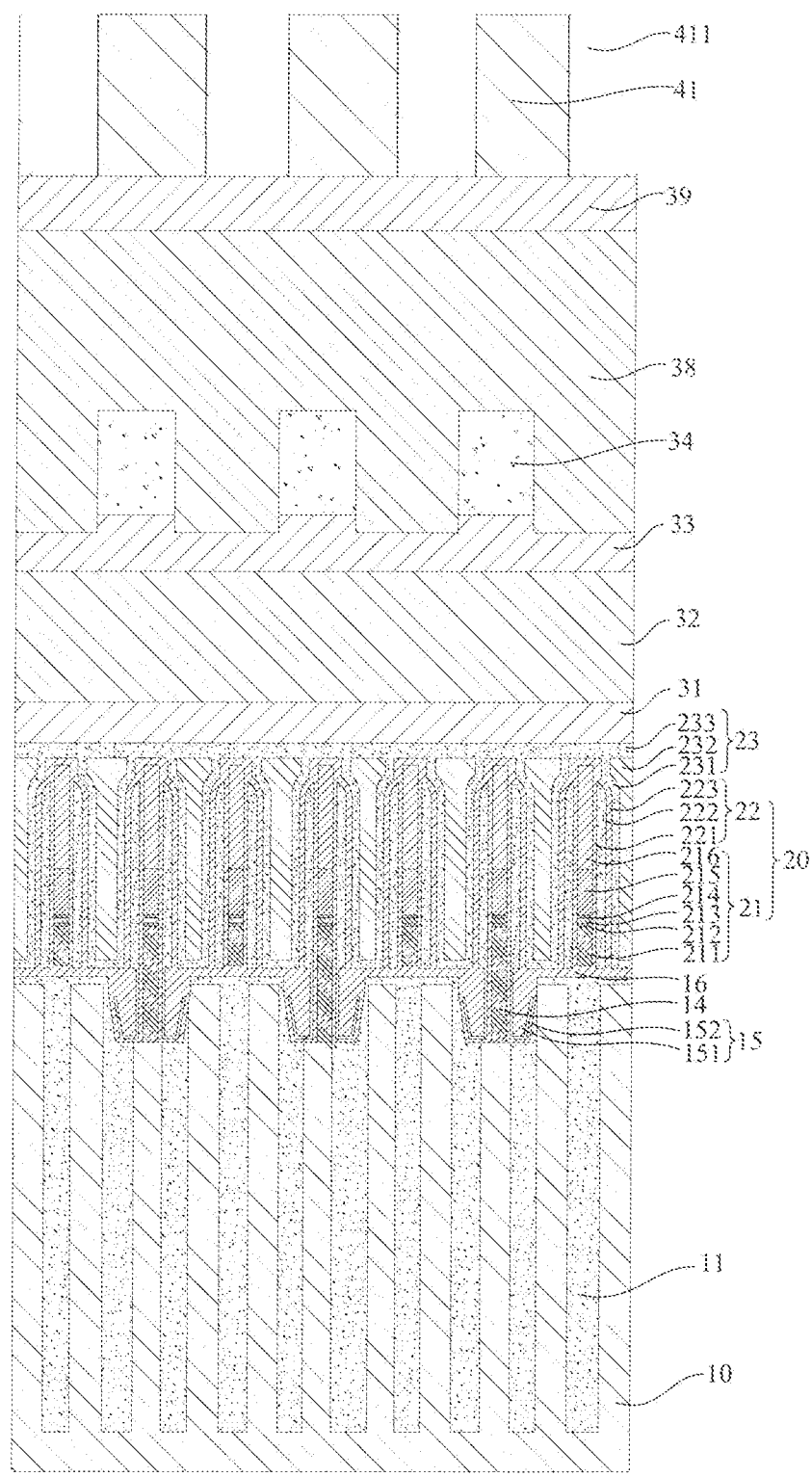

Step S306: Form a third patterned mask layer 41 on an upper surface of the fifth mask dielectric layer 39, a plurality of third opening patterns 411 arranged in rows and columns being formed in the third patterned mask layer 41, orthographic projection of each column of the third opening patterns 411 on an upper surface of the third mask dielectric layer 34 subjected to the first etching being located between adjacent columns of the second opening patterns 372, and staggered with the adjacent columns of the second opening patterns 372, as shown in FIG. 7a, FIG. 7b and FIG. 7c.

Step S307: Etch the fifth mask dielectric layer 39 and the third HM layer 38 sequentially based on the third patterned mask layer 41, and perform second etching on the third mask dielectric layer 34 to transfer the third opening patterns 411 to the third mask dielectric layer 34.

Step S308: Remove the third patterned mask layer 41, the fifth mask dielectric layer 39 and the third HM layer 38.

Figure 8A:
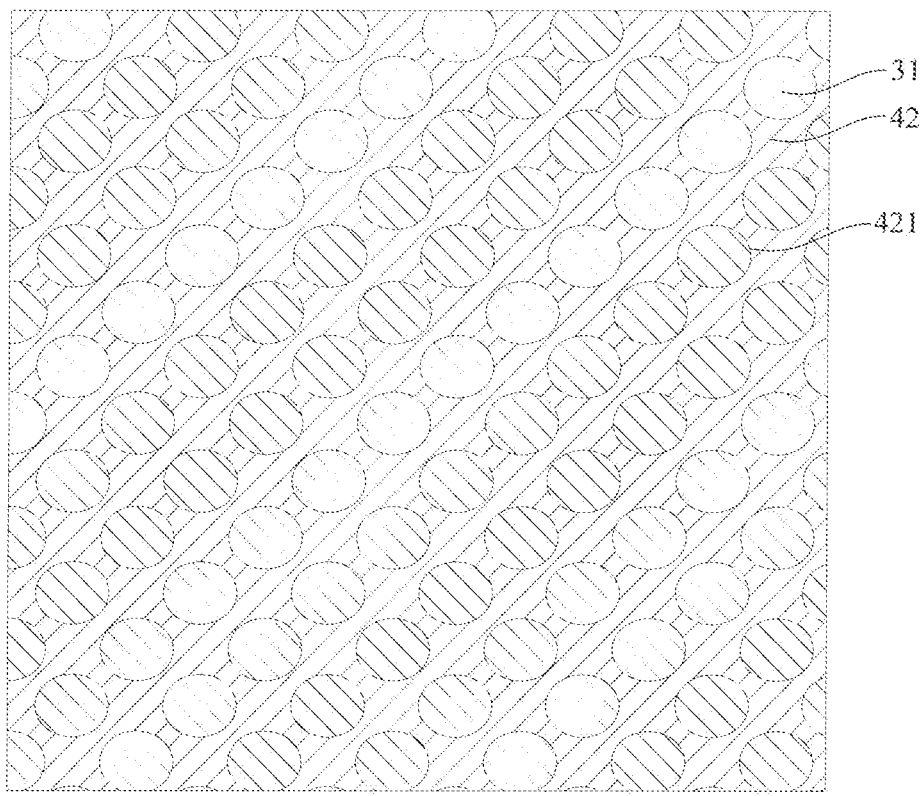
FIG. 8a is a top view of a fourth patterned mask layer according to an embodiment of the present application.
Figure 8B:
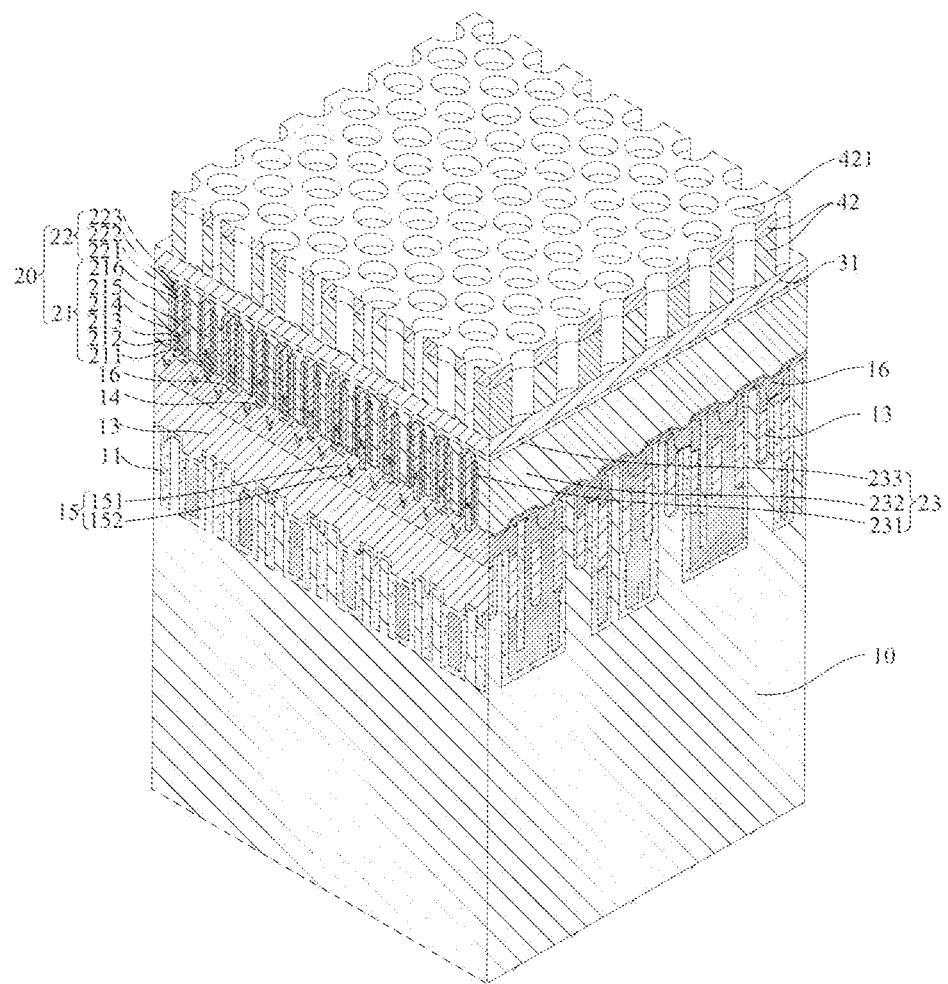
Figure 8C:
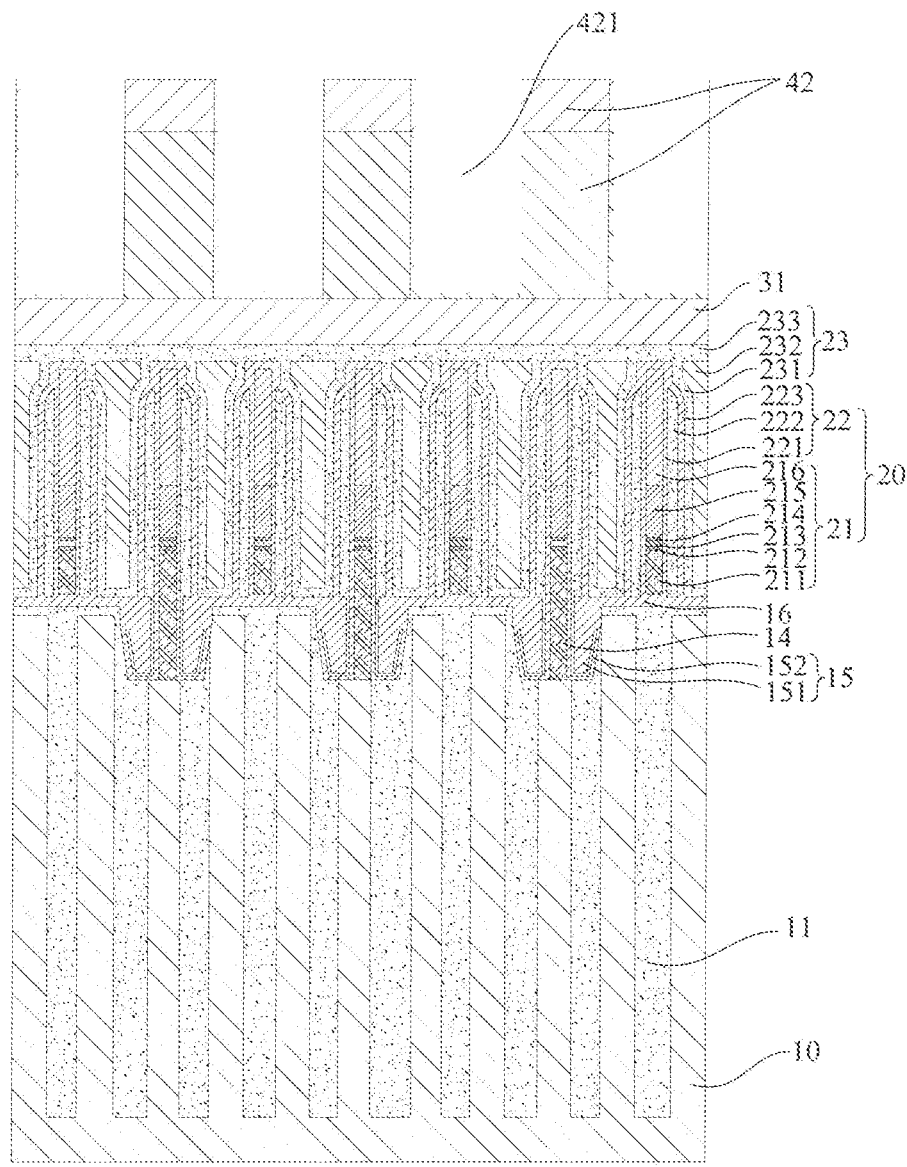

Step S309: Etch the second mask dielectric layer 33 and the first HM layer 32 based on the third mask dielectric layer 34 subjected to the second etching to obtain a fourth patterned mask layer 42, fourth opening patterns 421 corresponding to the second opening patterns 372 and the third opening patterns 411 being formed in the fourth patterned mask layer 42, as shown in FIG. 8a, FIG. 8b and FIG. 8c.

Figure 9A:
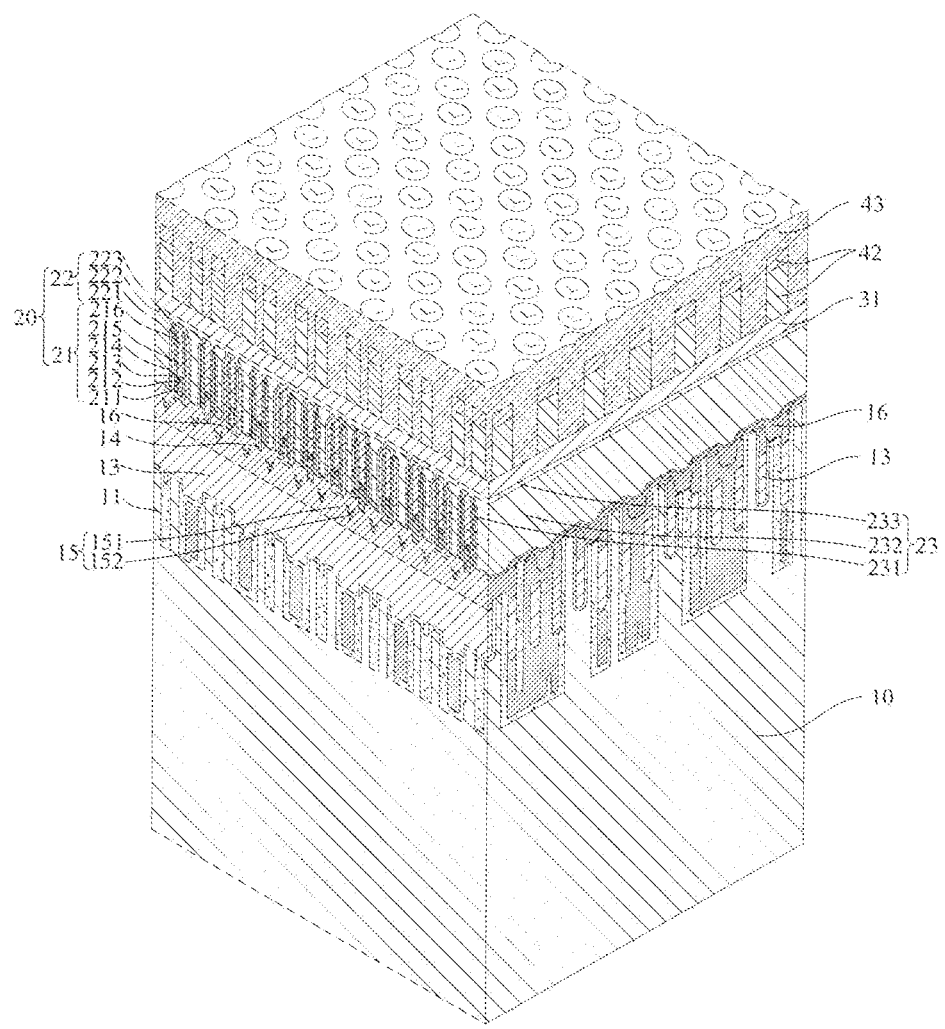
FIG. 9a is a stereoscopic view of a structure along a BB' direction in FIG. 2a after formation of a third filling dielectric layer according to an embodiment of the present application.
Figure 9B:
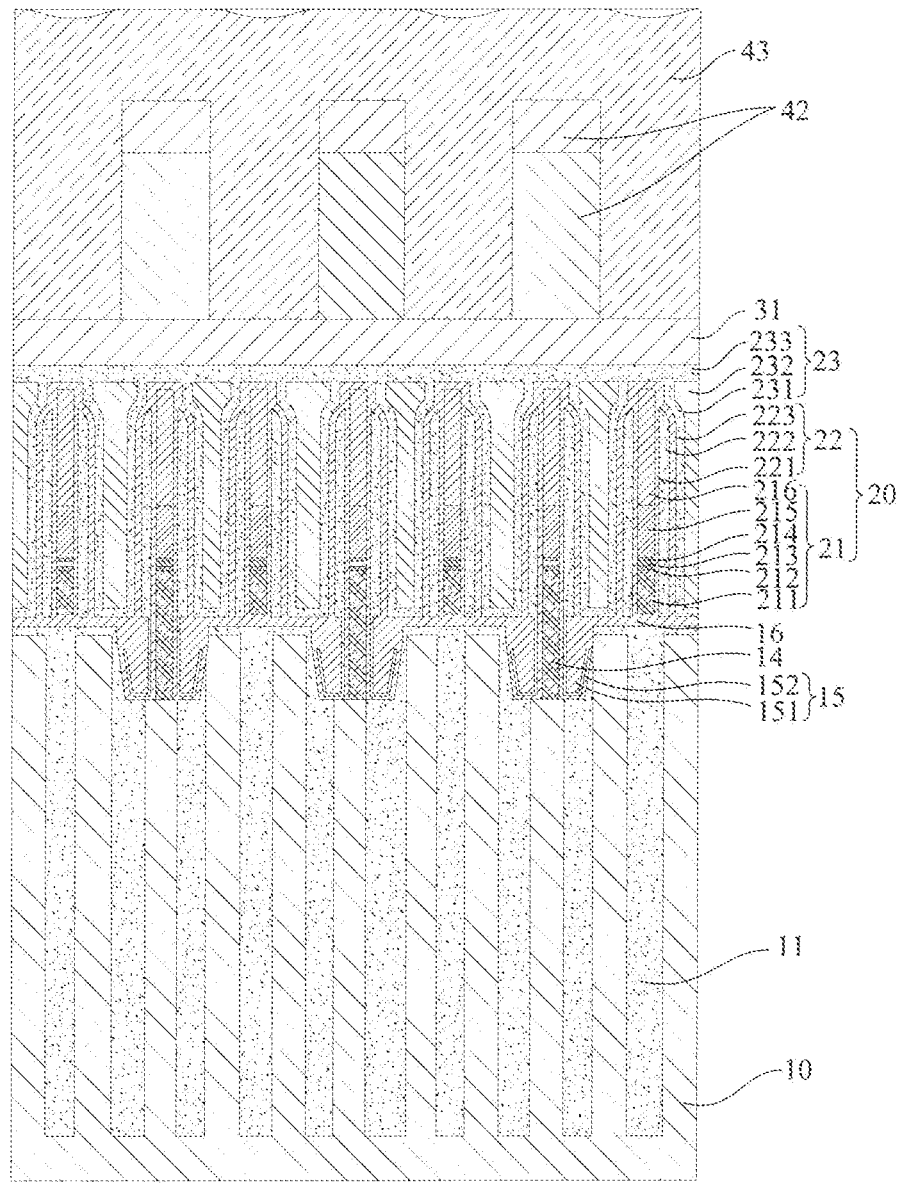

Step S310: Form a third filling dielectric layer 43, the third filling dielectric layer 43 filling up the fourth opening patterns 421 and covering the fourth patterned mask layer 42, as shown in FIG. 9a and FIG. 9b.

Figure 10A:
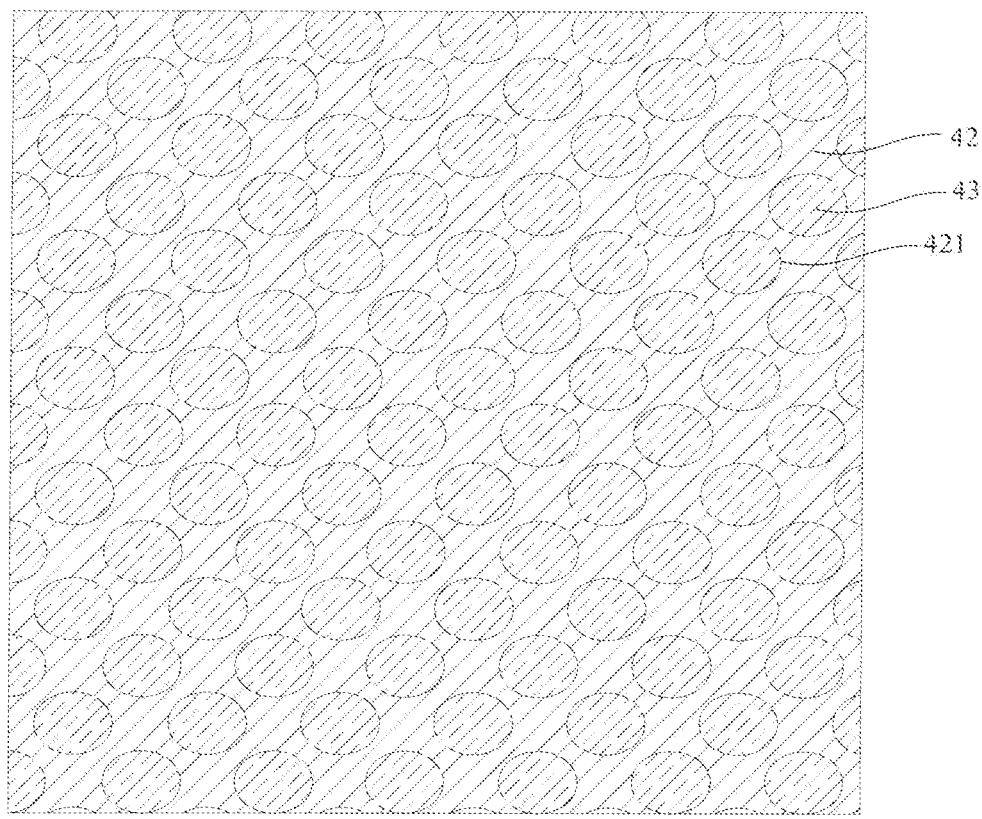
FIG. 10a is a top view of a structure after removal of a third filling dielectric layer on a fourth patterned mask layer according to an embodiment of the present application.
Figure 10B:
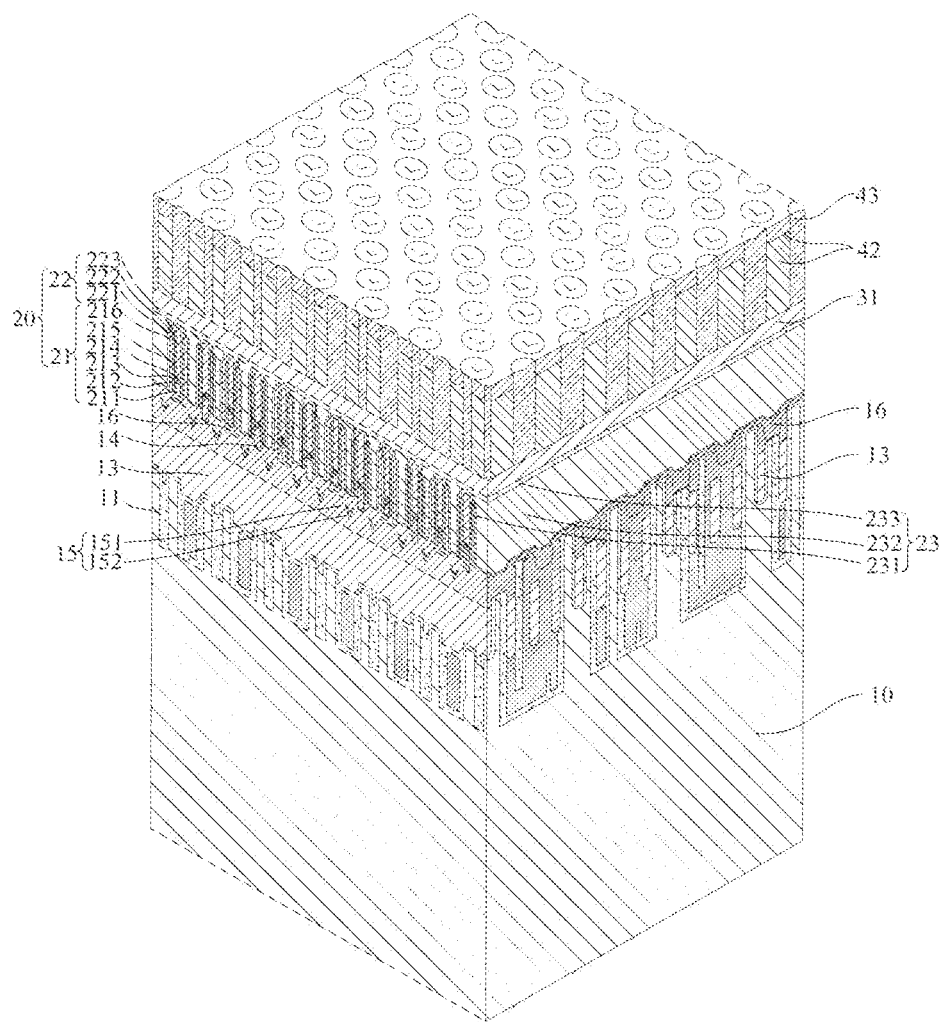
Figure 10C:
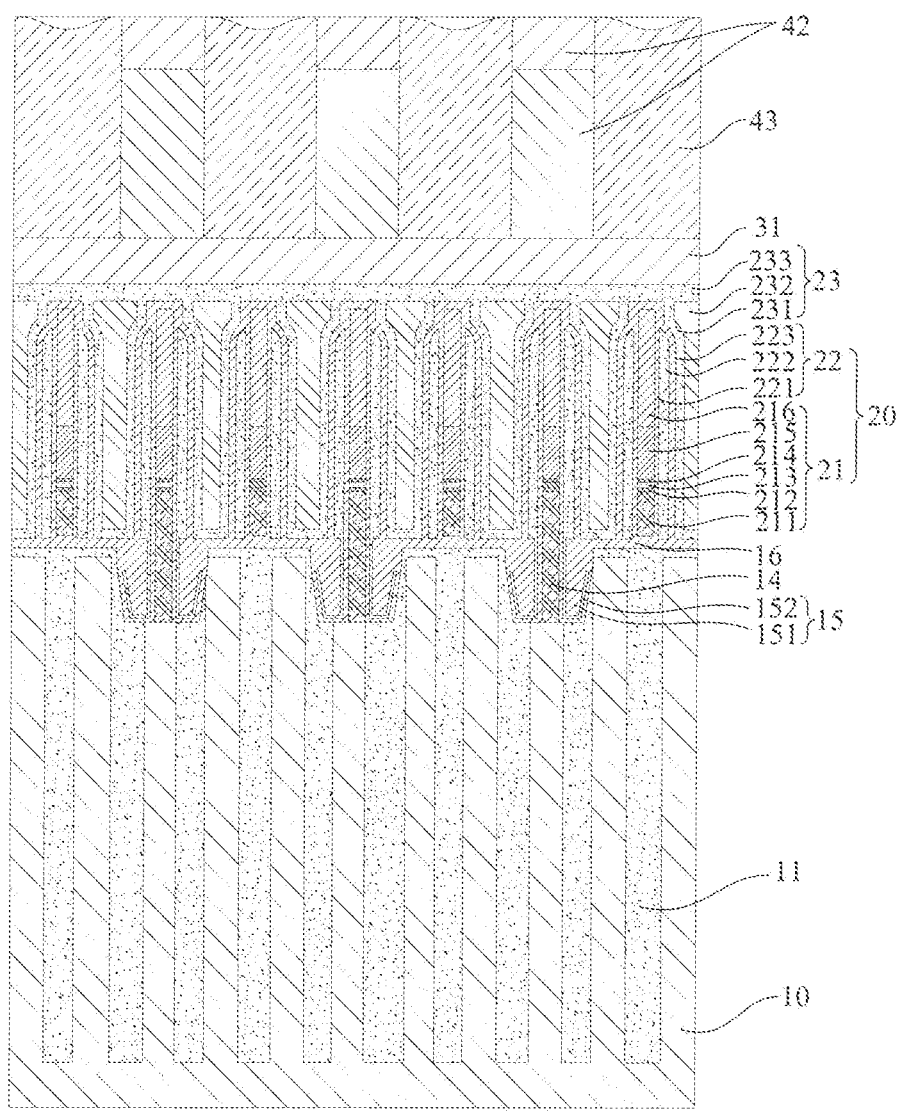
Figure 11A:
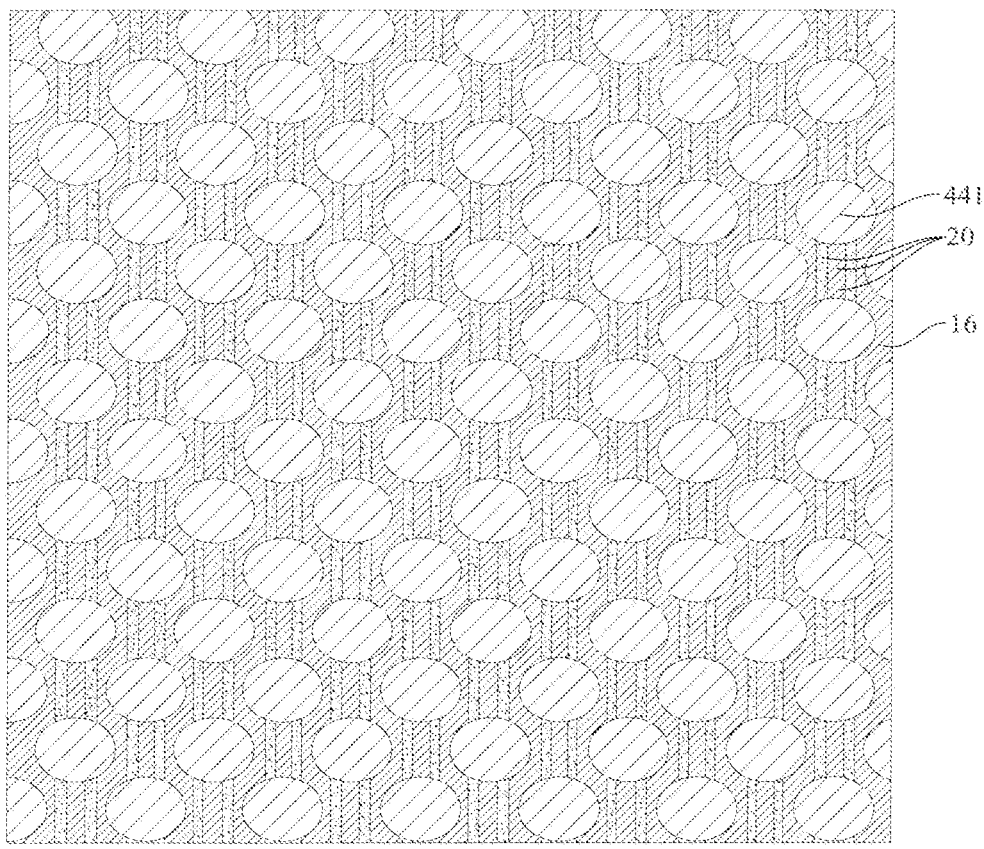
FIG. 11a is a top view of a structure after formation of etched recesses according to an embodiment of the present application.
Figure 11B:
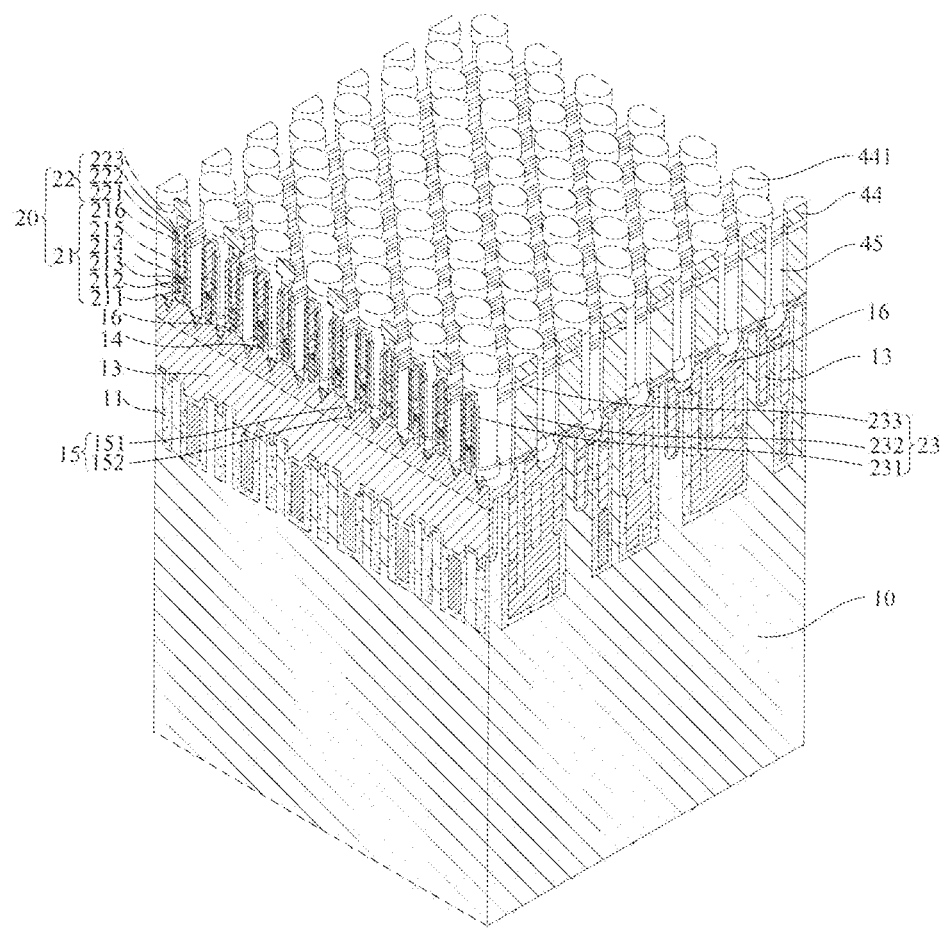
Figure 11C:
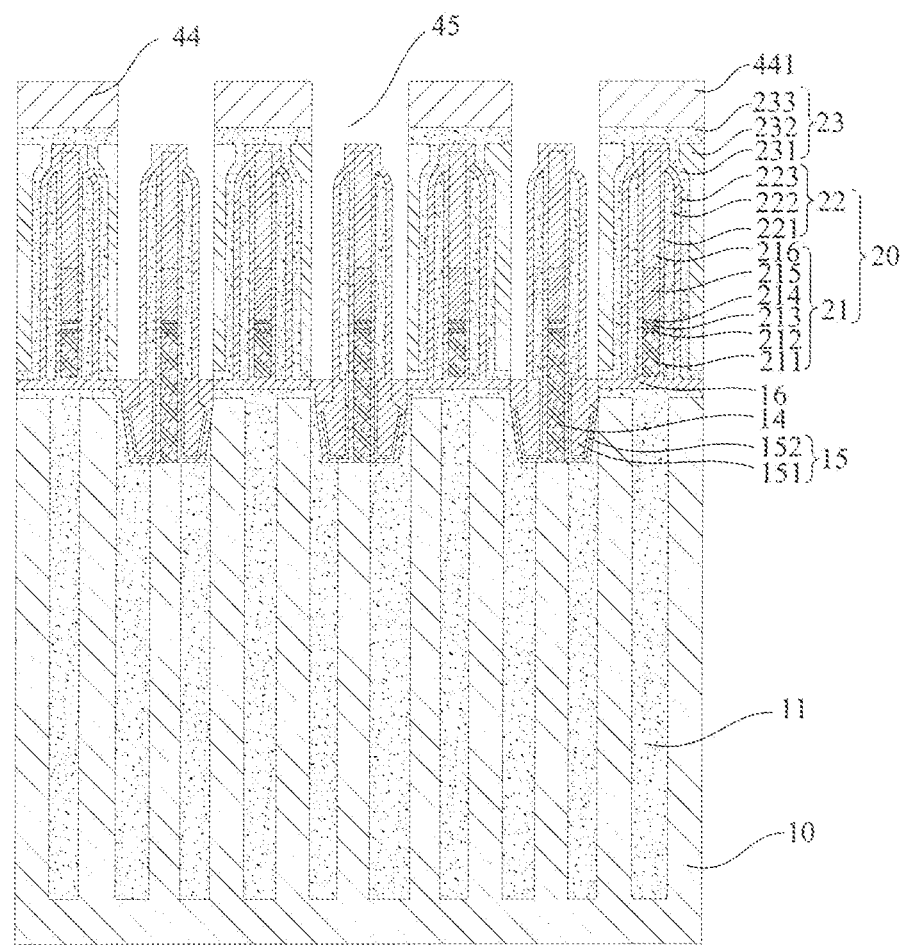

Step S311: Remove the third filling dielectric layer 43 on the fourth patterned mask layer 42, as shown in FIG. 10a, FIG. 10b and FIG. 10c, remove the fourth patterned mask layer 42 based on the remaining third filling dielectric layer 43, and etch the first mask dielectric layer 31 to obtain the first patterned mask layer 44, as shown in FIG. 11a, FIG. 11b and FIG. 11c.

As an example, the first mask dielectric layer 31, the second mask dielectric layer 33 and the fourth mask dielectric layer 36 formed in Step S301 are made of a material including but not limited to SiON. The first HM layer 32 and the second HM layer 35 are made of a material including but not limited to an HM. The third mask dielectric layer 34 is made of a material including but not limited to SiO$_2$.

As an example, the first opening patterns 371 and the second opening patterns 372 are arranged along a column direction, and the third opening patterns 411 are arranged along a row direction; or the first opening patterns 371 and the second opening patterns 372 are arranged along the row direction, and the third opening patterns 411 are arranged along the column direction. The first opening patterns 371 expose the fourth mask dielectric layer 36. The second opening patterns 372 expose the second mask dielectric layer 33 thereunder.

As an example, the fourth mask dielectric layer 36, the second HM layer 35 and the third mask dielectric layer 34 are etched with dry etching in Step S303 and Step S304. The second patterned mask layer 37, the remaining fourth mask dielectric layer 36 and the remaining second HM layer 35 may be removed with chemical mechanical polishing (CMP) or the dry etching. While the fourth mask dielectric layer 36 is removed with the dry etching, a part of the exposed second mask dielectric layer 33 thereunder is etched and thinned, such that a top of the finally exposed second mask dielectric layer 33 is slightly lower than a top of the second mask dielectric layer 33 under the third mask dielectric layer 34, as shown in FIG. 5c.

As an example, referring to FIG. 6b, the third HM layer 38 formed in Step S305 may be made of a material including but not limited to the HM, and the fifth mask dielectric layer 39 may be made of a material including but not limited to the SiON. The third opening patterns 411 in the third patterned mask layer 41 formed in Step S306 expose the fifth mask dielectric layer 39.

As an example, referring to FIG. 7b and FIG. 7c, the fifth mask dielectric layer 39 and the third HM layer 38 may be etched with the dry etching in Step S307 and Step S308. The etch selectivity for the fifth mask dielectric layer 39 and the third patterned mask layer 41 is greater than 1, and the etch selectivity for the third HM layer 38 and the third patterned mask layer 41 is greater than 1. The third patterned mask layer 41 and the fifth mask dielectric layer 39 are removed with the CMP or lateral etching. The remaining third HM layer 38 is then removed with the dry etching or wet etching.

As an example, referring to FIG. 8a and FIG. 8b, the second mask dielectric layer 33 and the first HM layer 32 are etched in Step S309 to obtain the fourth patterned mask layer 42. The fourth opening patterns 421 for exposing the first mask dielectric layer 31 are formed in the fourth patterned mask layer 42. The fourth opening patterns are arranged along the row direction and the column direction, in which the row direction is the same as the extension direction of the embedded gate WLs 13, and the column direction is the same as the extension direction of the BLs 20.

As an example, referring to FIG. 9a and FIG. 9b, the third filling dielectric layer 43 is formed in Step S310, because a deposition rate of the third filling dielectric layer 43 above the fourth opening patterns 421 is the same as that on other regions, depressions are formed above the fourth opening patterns 421, and an upper surface of the third filling dielectric layer 43 above the fourth opening patterns 421 is lower than an upper surface of the third filling dielectric layer 43 on the fourth patterned mask layer 42. The third filling dielectric layer 43 may be made of a material including but not limited to $SiO_2$, and may be manufactured with the TEOS, the LTO or the ALD.

As an example, referring to FIG. 10b and FIG. 10c, the third filling dielectric layer 43 on the fourth patterned mask layer 42 is removed with the CMP in Step S311. An upper surface of the remaining third filling dielectric layer 43 is lower than an upper surface of the fourth patterned mask layer 42. Referring to FIG. 11b and FIG. 11c, the etch selectivity for the fourth patterned mask layer 42 and the third filling dielectric layer 43 is greater than 1. The fourth patterned mask layer 42 is removed. As the third filling dielectric layer 43 and the first mask dielectric layer 31 are made of different materials, the first mask dielectric layer 31 is etched to convert the first mask dielectric layer 31 into the first patterned mask layer 44. The first patterned mask layer 44 exposes the first filling dielectric layer 23 thereunder.

In an embodiment, referring also to FIG. 1a, the first patterned mask layer 44 includes a plurality of pattern units 441. Orthographic projection of each of the pattern units 441 on the substrate 10 is stretched across one of the BLs 20 and partially located on two opposite sides of the one of the BLs 20. The first opening patterns 371, the second opening patterns 372, the third opening patterns 411 and the fourth opening patterns 421 are of a circular shape. Orthographic projection of each of the first opening patterns 371, the second opening patterns 372 and the third opening patterns 411 on the substrate 10 is stretched across at least one of the BLs, and orthographic projection of each of the fourth opening patterns 421 on the substrate 10 is stretched across all BLs.

In an embodiment, after Step S311 of forming a first patterned mask layer 44, the manufacturing method of a semiconductor structure further includes the following steps:

Step S312: The remaining third filling dielectric layer 43 is removed.

Specifically, the remaining third filling dielectric layer 43 is removed with the dry etching or the CMP, without affecting the exposed first filling dielectric layer 23.

In an embodiment, referring also to FIG. 11b and FIG. 11c, the first filling dielectric layer 23 between the pattern units 441 is etched with the dry etching based on the first patterned mask layer 44 in Step S40 to form etched recesses 45. The etched recesses 45 expose the bottom capping dielectric layer 16. When the first filling dielectric layer 23 is removed, the first filling dielectric layer 23 on two sides of adjacent BLs 20 is not etched, namely the first filling dielectric layer 23 under the pattern units 441 is still kept for subsequent manufacture of the capacitor contact holes.

Figure 12A:
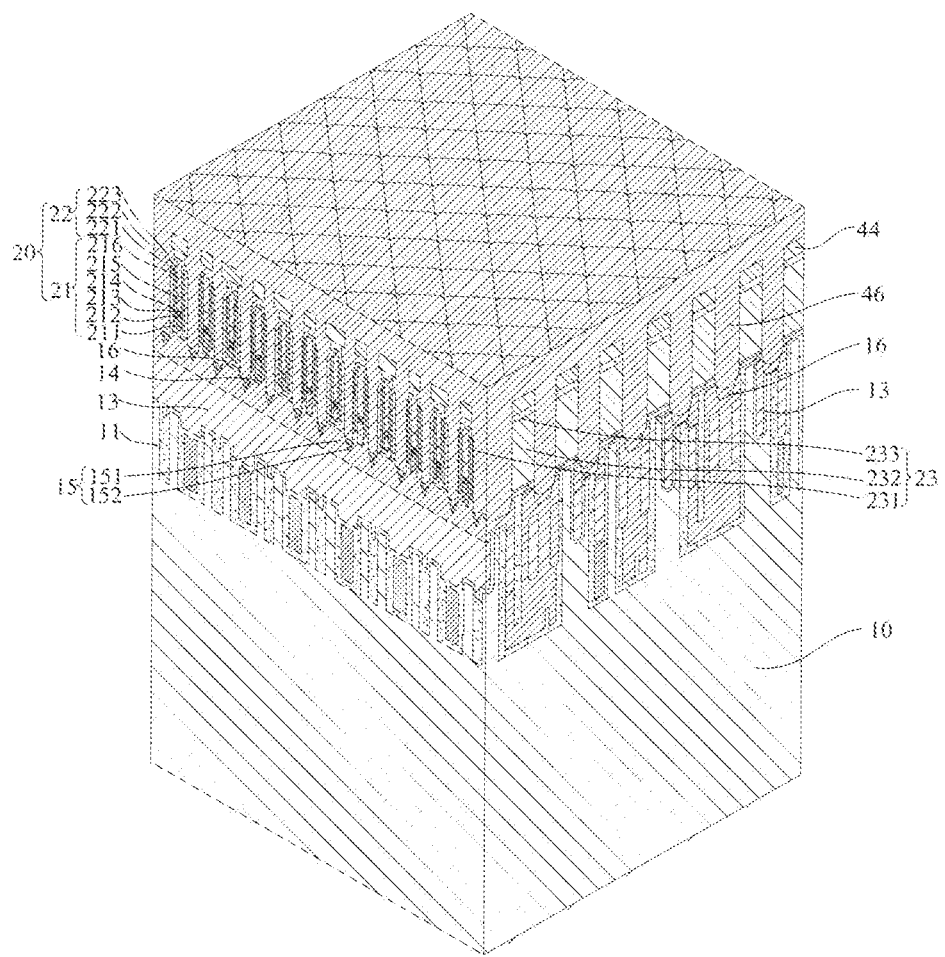
FIG. 12a is a stereoscopic view of a structure along a BB' direction in FIG. 2a after formation of a second filling dielectric layer according to an embodiment of the present application.
Figure 12B:
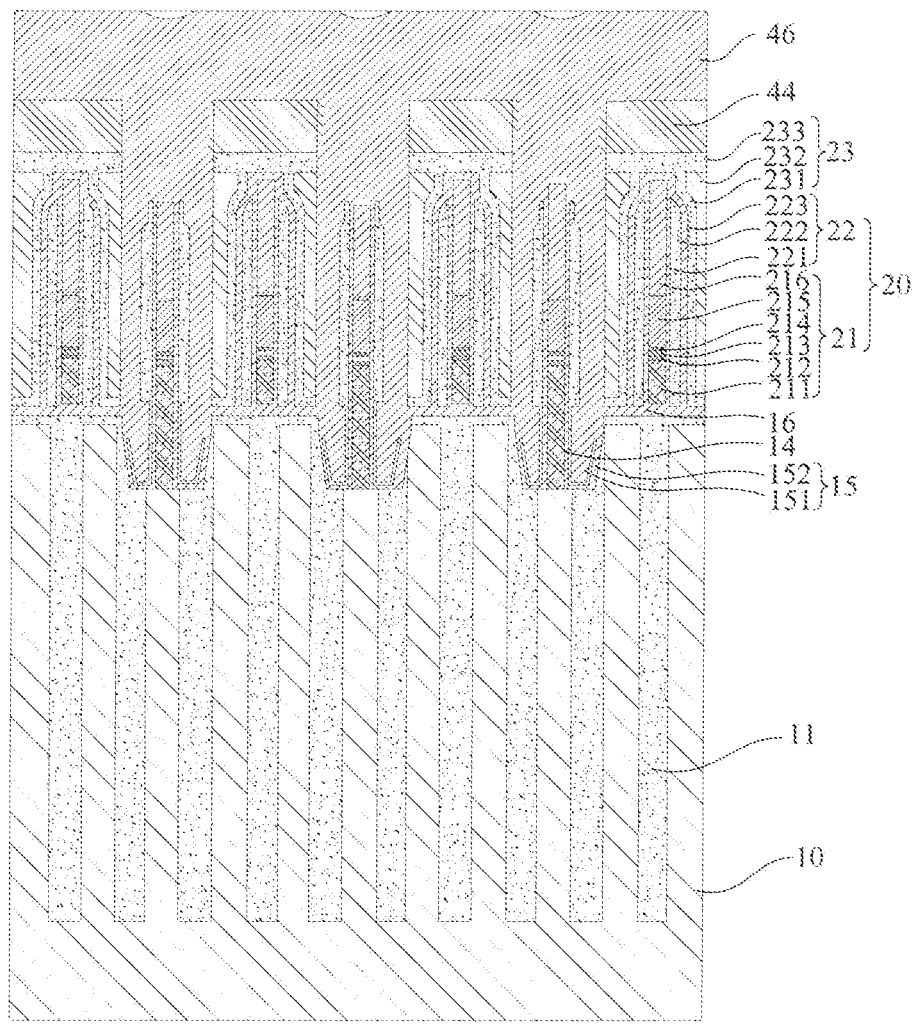

In an embodiment, referring to FIG. 12a and FIG. 12b, openings (not shown) are formed between the pattern units 441 in Step S50. Due to the openings and the etched recesses 45, depressions are formed on an upper surface of the second filling dielectric layer 46. An upper surface of the second filling dielectric layer 46 on the pattern units 441 is higher than an upper surface of the second filling dielectric layer 46 on the etched recesses 45. The etched recesses 45 expose the capping dielectric layer 16. The second filling dielectric layer 46 isolates adjacent capacitor contact structures (not shown) that are subsequently formed, thereby effectively reducing the parasitic capacitance between the BLs 20 and the capacitor contact structures. As an example, the second filling dielectric layer 46 may be made of a material including but not limited to $Si_3N_4$, and may be manufactured with the ALD.

Figure 13A:
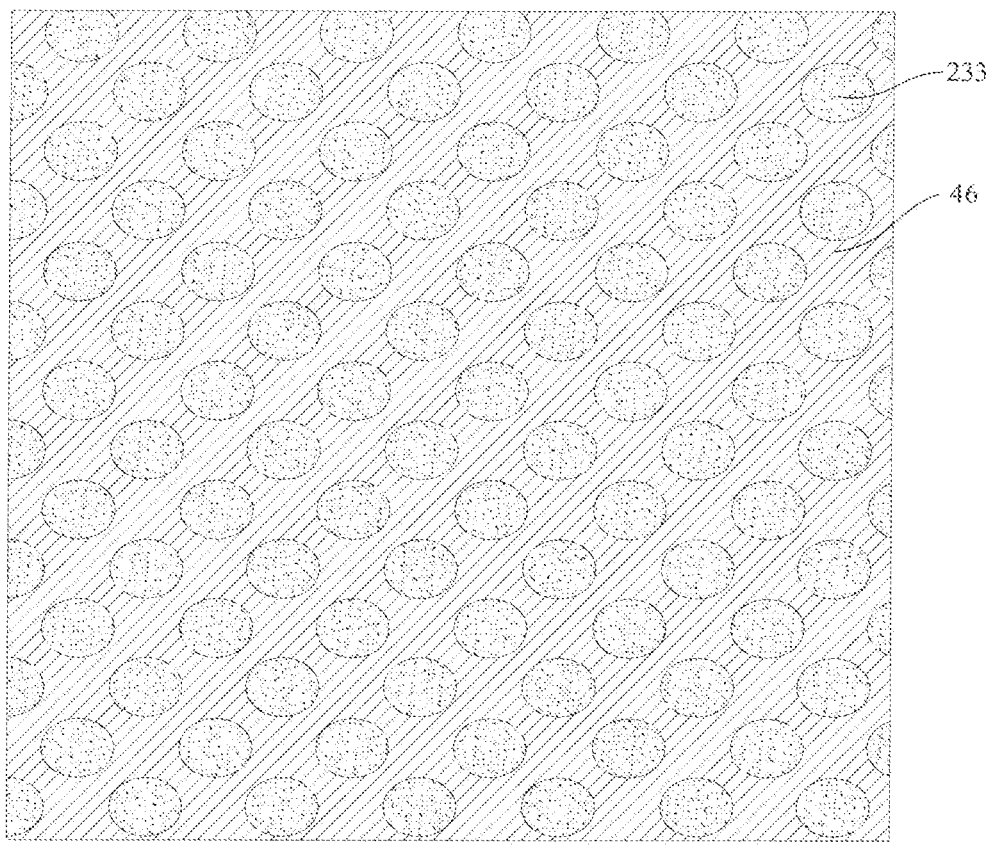
FIG. 13a is a top view of a structure after removal of a first patterned mask layer and parts of a second filling dielectric layer on the first patterned mask layer and between pattern units according to an embodiment of the present application.
Figure 13B:
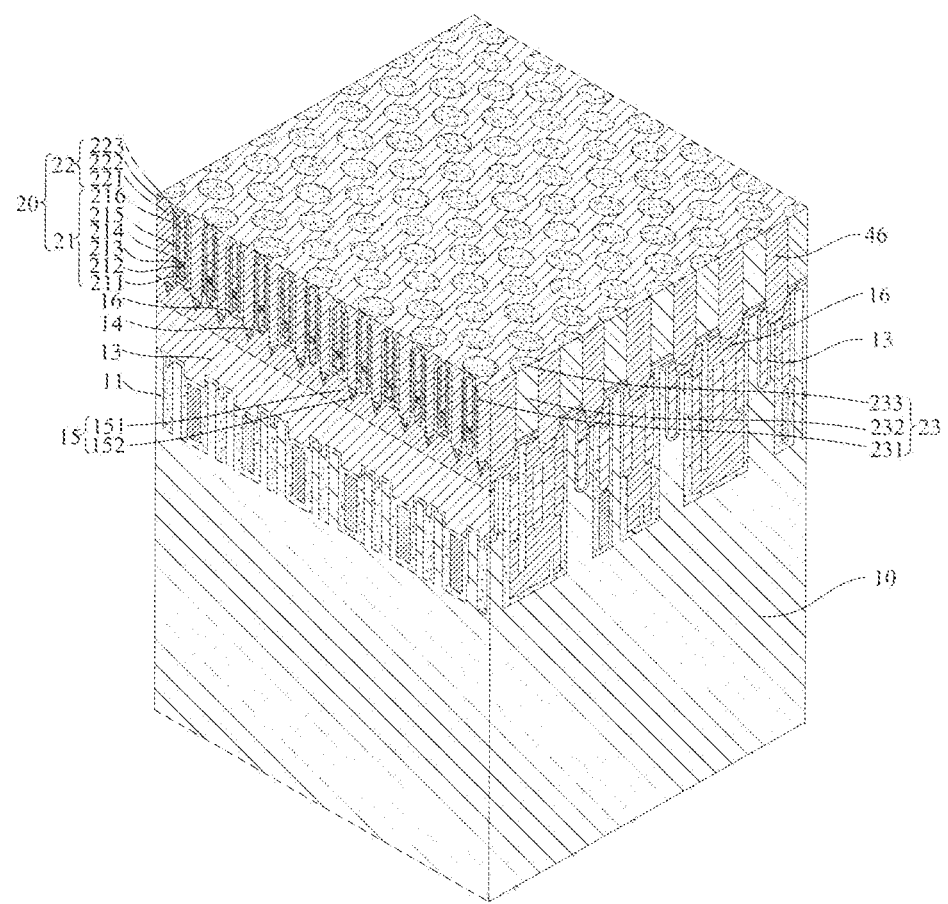
Figure 13C:
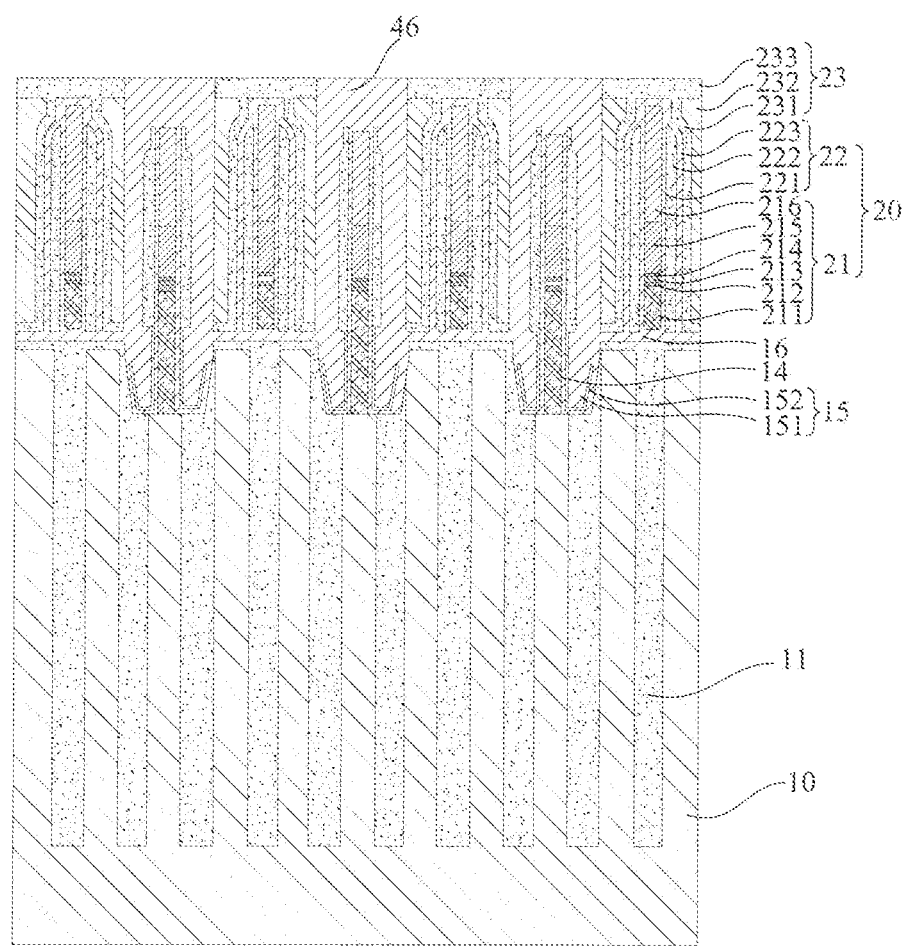

In an embodiment, referring to FIG. 13a, FIG. 13b and FIG. 13c, the first patterned mask layer 44 and the second filling dielectric layer 46 are removed with the CMP in Step S60, until the first filling dielectric layer 23 is exposed, and the depressions arising from the etched recesses in FIG. 12 are eliminated. The pattern units 441 on the upper surface of the remaining first filling dielectric layer 23 are the same in shape and arranged in rows and columns.

Figure 14A:
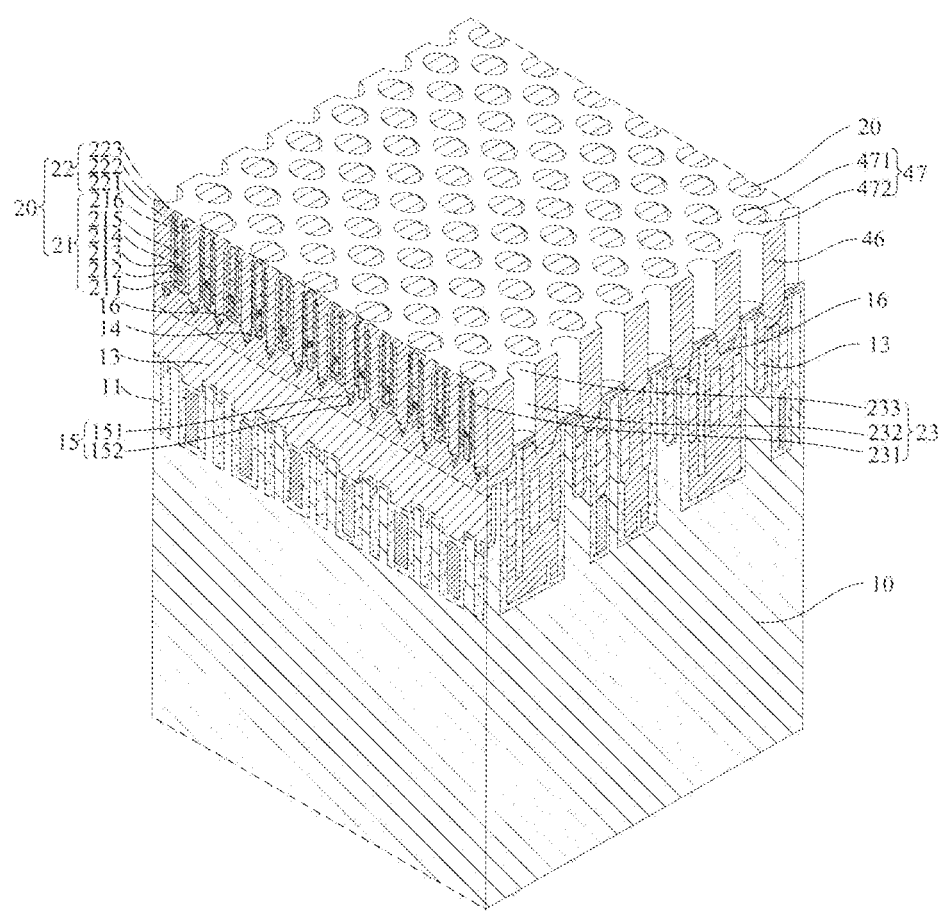
FIG. 14a is a stereoscopic view of a structure along a BB' direction in FIG. 2a after removal of a remaining first filling dielectric layer according to an embodiment of the present application.
Figure 14B:
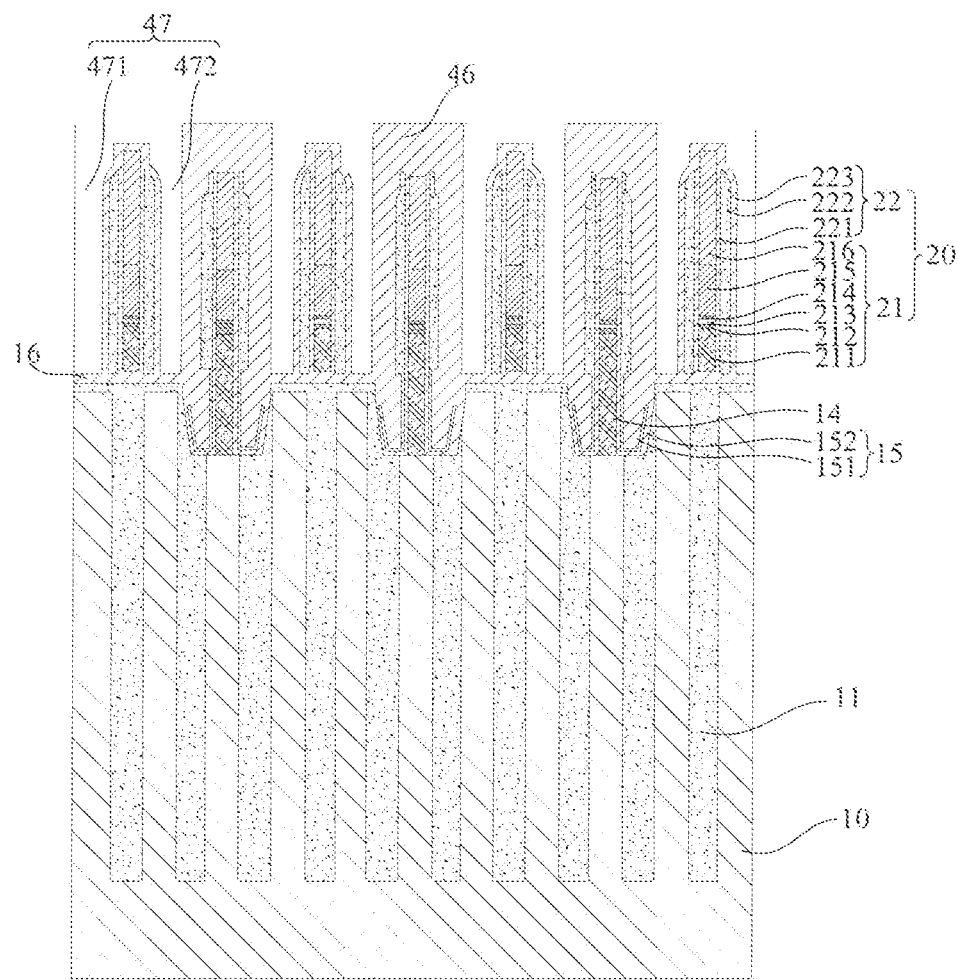

In an embodiment, as shown in FIG. 14a and FIG. 14b, the remaining first filling dielectric layer 23 may be removed with the wet etching in Step S70 to form capacitor contact holes 47 arranged in rows and columns. Adjacent columns of the capacitor contact holes 47 are staggered. The capacitor contact holes 47 expose the capping dielectric layer 16. The capacitor contact holes 47 each include a first sub-contact-hole 471 and a second sub-contact-hole 472 located on two opposite sides of the BLs 20. Both the first sub-contact-hole 471 and the second sub-contact-hole 472 are of a half-moon shape.

Figure 15A:
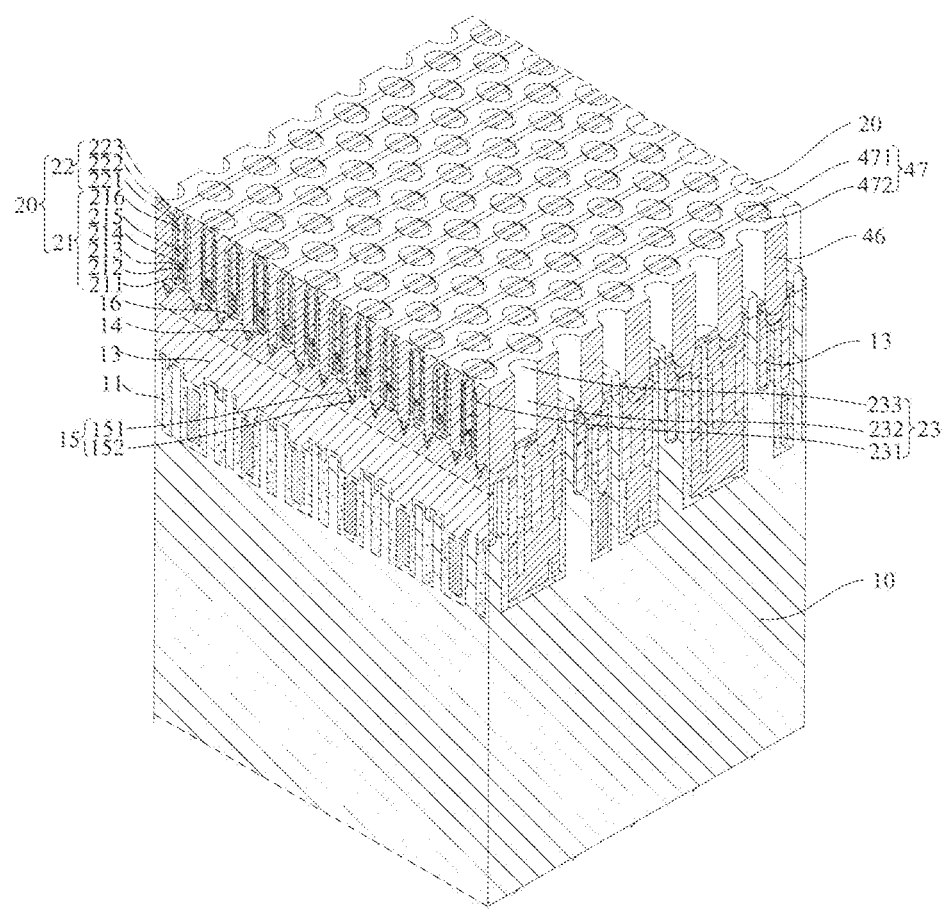
FIG. 15a is a stereoscopic view of a structure along a BB' direction in FIG. 2a after removal of a capping dielectric layer in capacitor contact holes according to an embodiment of the present application.
Figure 15B:
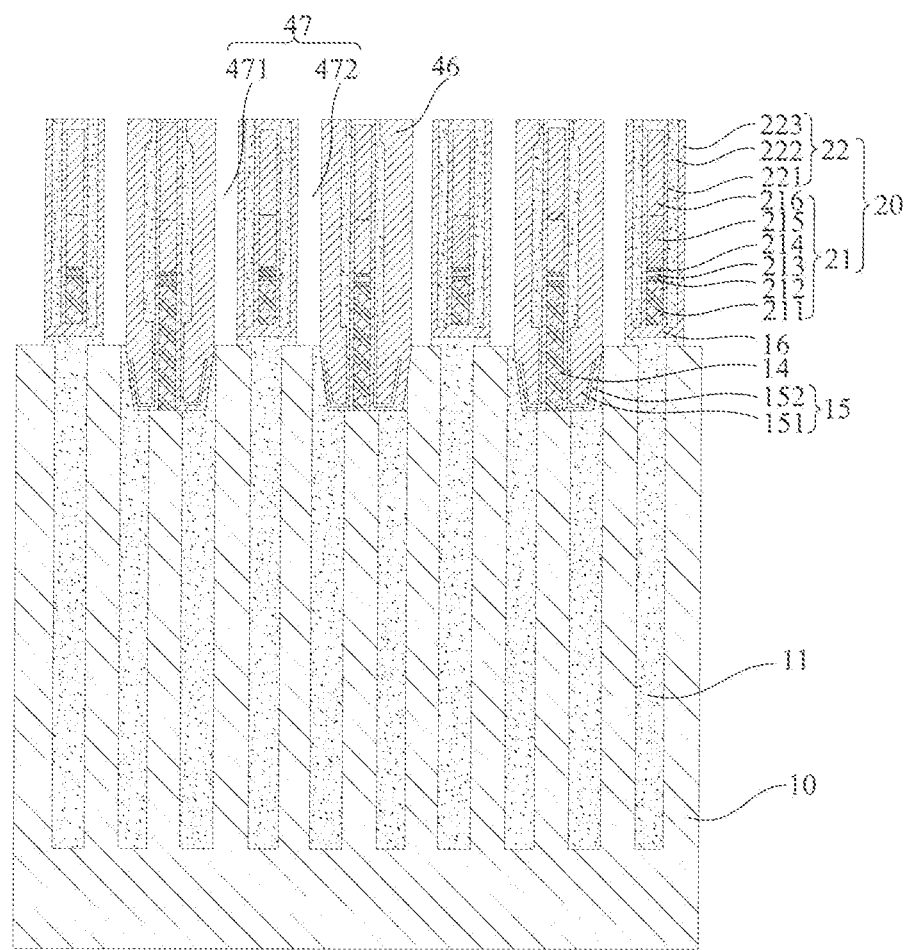

In an embodiment, as shown in FIG. 15a and FIG. 15b, after Step S70 of removing the remaining first filling dielectric layer, and before Step S80 of forming capacitor contact structures in the capacitor contact holes, the manufacturing method of a semiconductor structure further includes the following step:

Step S71: Remove the capping dielectric layer 16 in the capacitor contact holes 47, such that the capacitor contact holes 47 penetrate through the capping dielectric layer 16 to expose the active areas 12. The capping dielectric layer 16 between the BLs 20 and the substrate 10 is still retained.

Figure 16A:
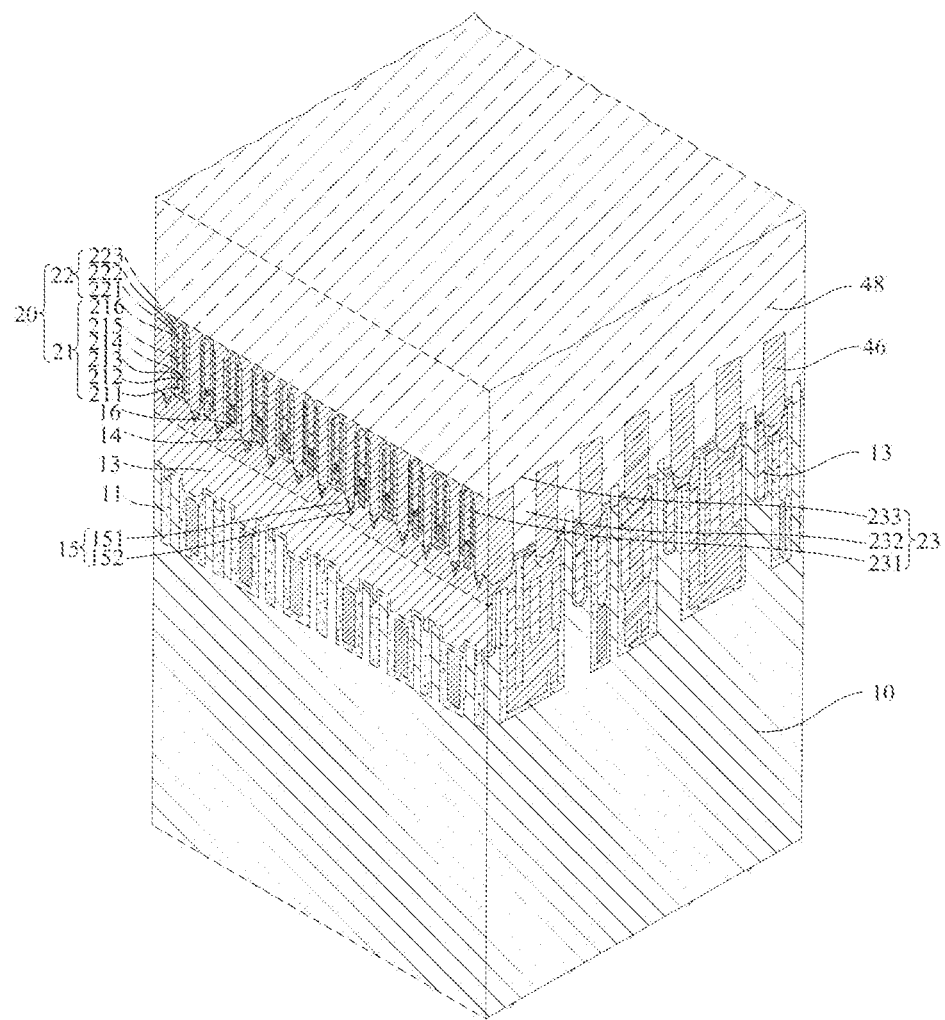
FIG. 16a is a stereoscopic view of a structure along a BB' direction in FIG. 2a after formation of a capacitor contact material layer according to an embodiment of the present application.
Figure 16B:
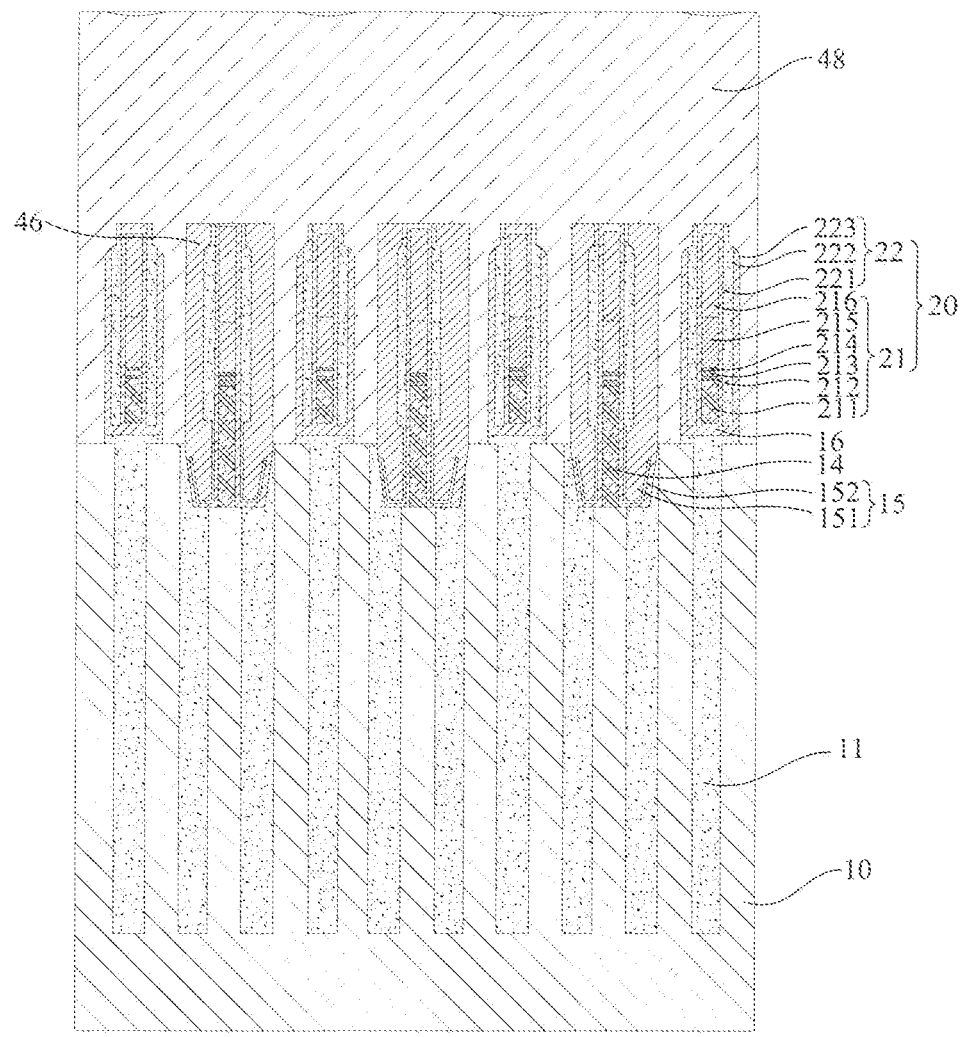

In an embodiment, Step S80 of forming capacitor contact structures in the capacitor contact holes includes the following steps:

Step S81: Form a capacitor contact material layer 48, the capacitor contact material layer 48 filling up the capacitor contact holes 47 and covering the BLs 20 and the second filling dielectric layer 46, as shown in FIG. 16a and FIG. 16b.

Figure 17A:
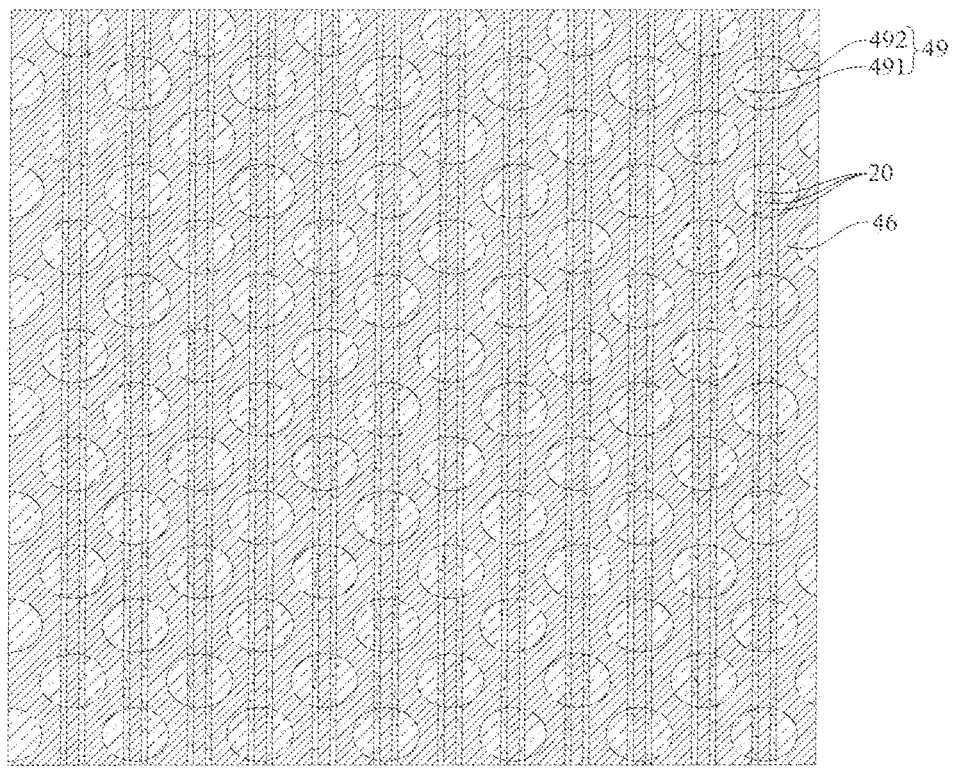
FIG. 17a is a top view of a structure after formation of capacitor contact structures according to an embodiment of the present application.
Figure 17B:
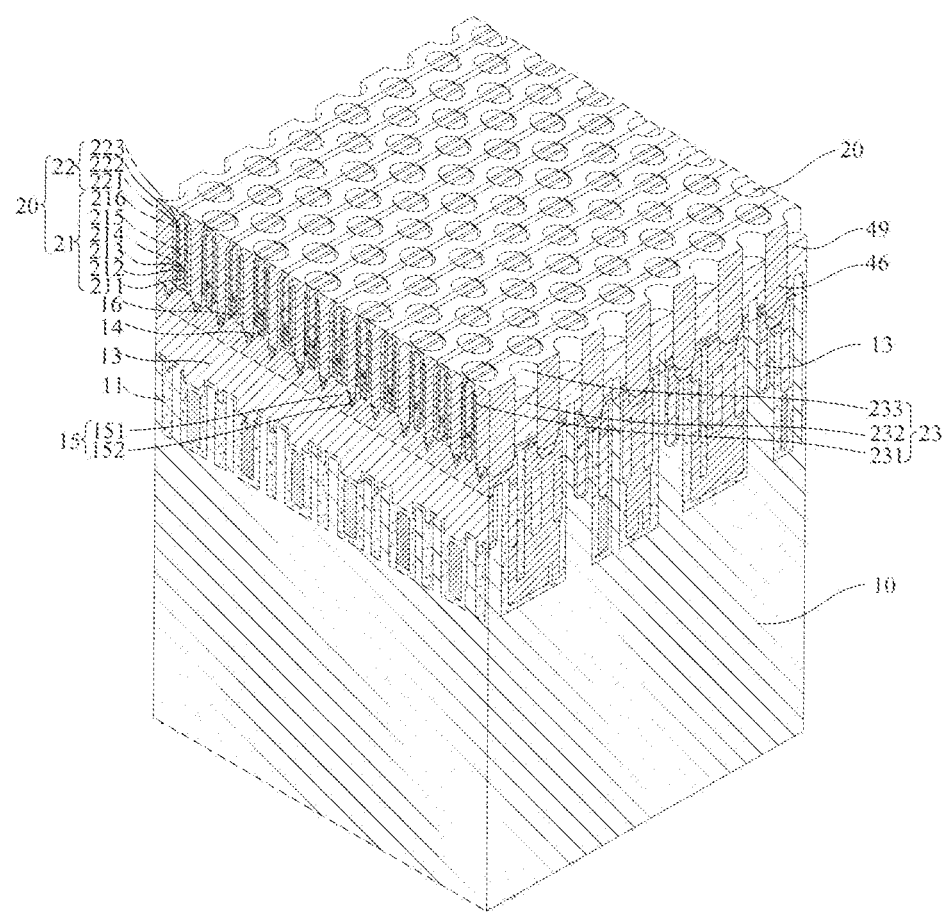
Figure 17C:
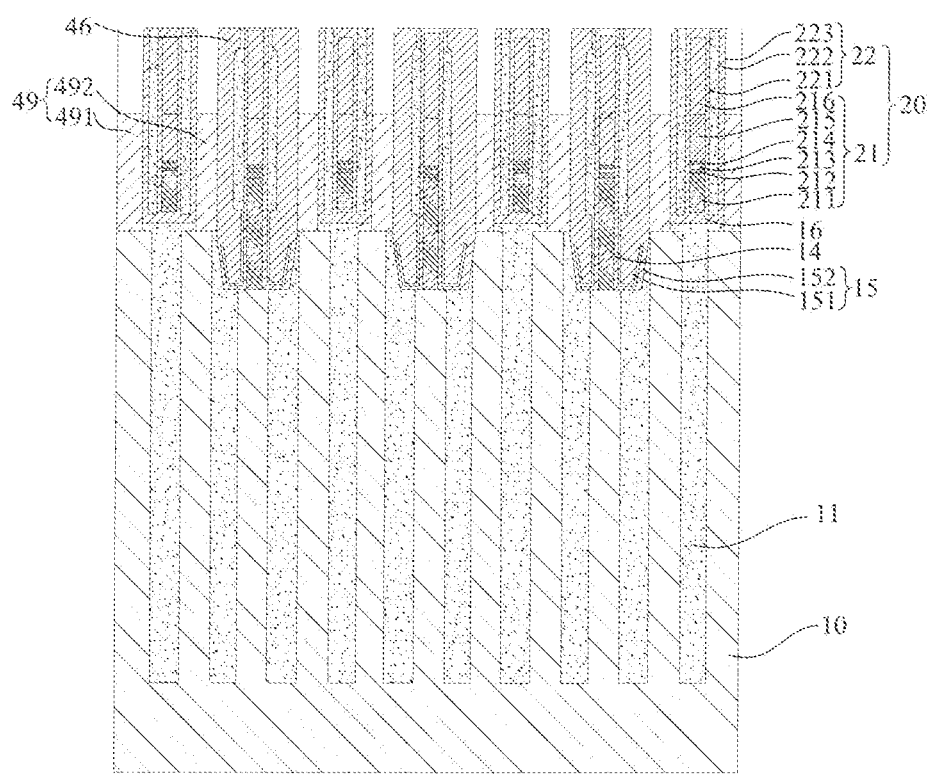

Step S82: Remove the capacitor contact material layer 48 on the BLs 20 and the capacitor contact material layer 48 on the second filling dielectric layer 46, and etch back the capacitor contact material layer 48 in the capacitor contact holes 47 to obtain the capacitor contact structures 49, as shown in FIG. 17a, FIG. 17b and FIG. 17c. Upper surfaces of the capacitor contact structures 49 are lower than upper surfaces of the BLs 20. A space is reserved in each of the capacitor contact holes 47 to subsequently manufacture a capacitor contact plug (not shown in the figures).

As an example, the capacitor contact material layer 48 on the BLs 20 and the second filling dielectric layer 46 is thinned with the CMP in Step S82, until the second filling dielectric layer 46 is exposed. The capacitor contact material layer 48 is made of a material including but not limited to polycrystalline silicon.

In an embodiment, referring also to FIG. 17c, the capacitor contact structures 49 each include a first sub-contact-structure 491 corresponding to the first sub-contact-hole 471 and a second sub-contact-structure 492 corresponding to the second sub-contact-hole 472. The first sub-contact-structure 491 and the second sub-contact-structure 492 are of a half-moon shape. The capacitor contact structures 49 are arranged in rows and columns, and adjacent columns of the capacitor contact structures 49 are staggered. The capacitor contact structures 49 contact the active areas 12.

An embodiment of the present application further provides a semiconductor structure, including: a substrate 10, the substrate 10 being provided with spaced active areas 12 therein and a plurality of parallel spaced BLs 20 thereon; a filling dielectric layer, located between adjacent BLs 20; and capacitor contact structures 49, located in the filling dielectric layer. The capacitor contact structures 49 each include a first sub-contact-structure 491 and a second sub-contact-structure 492. The first sub-contact-structure 491 and the second sub-contact-structure 492 are located on two opposite sides of each of the BLs 20.

Specifically, the filling dielectric layer may be a second filling dielectric layer 46 that isolates adjacent capacitor contact structures 49 to reduce the parasitic capacitance between the BLs 20 and the capacitor contact structures 49.

In an embodiment, there are a plurality of the capacitor contact structures 49 that are arranged in rows and columns, and adjacent columns of the capacitor contact structures 49 are staggered.

In an embodiment, upper surfaces of the capacitor contact structures 49 are lower than upper surfaces of the BLs 20.

In an embodiment, the first sub-contact-structure 491 and the second sub-contact-structure 492 are of a half-moon shape.

In an embodiment, the semiconductor structure further includes STI structures 11, the STI structures 11 isolates, in the substrate 10, the active areas 12 arranged in an array; and bottoms of the capacitor contact structures 49 are in contact with the active areas 12.

In an embodiment, a plurality of parallel spaced embedded gate WLs 13 are further formed in the substrate 10, and an extension direction of the embedded gate WLs 13 is intersected with an extension direction of the BLs 20 and an extension direction of the active areas 12.

In an embodiment, the BLs 20 extend along a column direction, the embedded gate WLs 13 extend along a row direction, and the active areas 12 each extends along a direction forming a preset included angle with each of the BLs 20.

It may be noted that the foregoing embodiments are merely for the purpose of description instead of limiting the present application.

It should be understood that the execution order of the steps is not strictly limited, and the steps may be executed in other orders, unless clearly described otherwise. Moreover, at least some of the steps may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

The embodiments of this specification are described in a progressive manner. Each embodiment focuses on the difference from other embodiments, and the same and similar parts between the embodiments may refer to each other.

The technical characteristics of the above embodiments can be employed in arbitrary combinations. In an effort to provide a concise description of these embodiments, not all possible combinations of all technical characteristics of the embodiments are described; however, these combinations of technical characteristics should be construed as disclosed in the description as long as no contradiction occurs.

The invention claimed is:

1. A manufacturing method of a semiconductor structure, comprising:
   providing a substrate, the substrate being provided with spaced active areas therein and a plurality of parallel spaced bit lines thereon;
   forming a first filling dielectric layer, the first filling dielectric layer filling up gaps between adjacent bit lines and covering tops of the bit lines;
   forming a first patterned mask layer on an upper surface of the first filling dielectric layer, the first patterned mask layer comprising a plurality of pattern units, and orthographic projection of each of the pattern units on the substrate being stretched across one of the bit lines and partially located on two opposite sides of the one of the bit lines;
   etching the first filling dielectric layer based on the first patterned mask layer to form etched recesses, the etched recesses exposing the substrate;
   forming a second filling dielectric layer, the second filling dielectric layer filling up the etched recesses and covering the first patterned mask layer;
   removing the first patterned mask layer, and parts of the second filling dielectric layer on the first patterned mask layer and between the pattern units;
   removing the remaining first filling dielectric layer to form a plurality of capacitor contact holes, the capacitor contact holes exposing the substrate, and the capacitor contact holes each comprising a first sub-contact-hole and a second sub-contact-hole on the two opposite sides of each of the bit lines; and
   forming capacitor contact structures in the capacitor contact holes, the capacitor contact structures each comprising a first sub-contact-structure corresponding to the first sub-contact-hole and a second sub-contact-structure corresponding to the second sub-contact-hole.

2. The manufacturing method of a semiconductor structure according to claim 1, wherein the forming a first patterned mask layer on an upper surface of the first filling dielectric layer comprises:
   forming, on the upper surface of the first filling dielectric layer, a first mask dielectric layer, a first hard mask layer, a second mask dielectric layer, a third mask dielectric layer, a second hard mask layer and a fourth mask dielectric layer that are stacked sequentially from the bottom up;
   forming a second patterned mask layer on an upper surface of the fourth mask dielectric layer, a plurality of first opening patterns arranged in rows and columns being formed in the second patterned mask layer;
   etching the fourth mask dielectric layer and the second hard mask layer based on the second patterned mask layer, and performing first etching on the third mask dielectric layer to form second opening patterns corresponding to the first opening patterns in the third mask dielectric layer;
   removing the second patterned mask layer, the fourth mask dielectric layer and the second hard mask layer;

forming a third hard mask layer and a fifth mask dielectric layer that are stacked sequentially from the bottom up, the third hard mask layer filling up the second opening patterns and covering the third mask dielectric layer subjected to the first etching;

forming a third patterned mask layer on an upper surface of the fifth mask dielectric layer, a plurality of third opening patterns arranged in rows and columns being formed in the third patterned mask layer, orthographic projection of each column of the third opening patterns on an upper surface of the third mask dielectric layer subjected to the first etching being located between adjacent columns of the second opening patterns, and staggered with the adjacent columns of the second opening patterns;

etching the fifth mask dielectric layer and the third hard mask layer sequentially based on the third patterned mask layer, and performing second etching on the third mask dielectric layer to transfer the third opening patterns into the third mask dielectric layer;

removing the third patterned mask layer, the fifth mask dielectric layer and the third hard mask layer;

etching the second mask dielectric layer and the first hard mask layer based on the third mask dielectric layer subjected to the second etching to obtain a fourth patterned mask layer, fourth opening patterns corresponding to the second opening patterns and the third opening patterns being formed in the fourth patterned mask layer;

forming a third filling dielectric layer, the third filling dielectric layer filling up the fourth opening patterns and covering the fourth patterned mask layer; and removing the third filling dielectric layer on the fourth patterned mask layer, removing the fourth patterned mask layer based on a remaining third filling dielectric layer, and etching the first mask dielectric layer to obtain the first patterned mask layer.

3. The manufacturing method of a semiconductor structure according to claim 2, after the forming a first patterned mask layer, further comprising:
removing the remaining third filling dielectric layer.

4. The manufacturing method of a semiconductor structure according to claim 3, wherein the first opening patterns, the second opening patterns and the third opening patterns are of a circular shape, and the first sub-contact-hole, the second sub-contact-hole, the first sub-contact-structure and the second sub-contact-structure are of a half-moon shape.

5. The manufacturing method of a semiconductor structure according to claim 2, wherein the capacitor contact structures are arranged in rows and columns, and adjacent columns of the capacitor contact structures are staggered.

6. The manufacturing method of a semiconductor structure according to claim 1, wherein the forming capacitor contact structures in the capacitor contact holes comprises:
forming a capacitor contact material layer, the capacitor contact material layer filling up the capacitor contact holes and covering the bit lines and the second filling dielectric layer; and
removing the capacitor contact material layer on the bit lines and the capacitor contact material layer on the second filling dielectric layer, and etching back the capacitor contact material layer in the capacitor contact holes to obtain the capacitor contact structures, upper surfaces of the capacitor contact structures being lower than upper surfaces of the bit lines.

7. The manufacturing method of a semiconductor structure according to claim 1, wherein shallow trench isolation structures are formed in the substrate, the shallow trench isolation structures isolating, in the substrate, the active areas arranged in an array; and bottoms of the capacitor contact structures are in contact with the active areas.

8. The manufacturing method of a semiconductor structure according to claim 7, wherein a capping dielectric layer is formed in an upper surface of the substrate; and after the removing a remaining first filling dielectric layer, and before the forming capacitor contact structures in the capacitor contact holes, the manufacturing method of a semiconductor structure further comprises: removing the capping dielectric layer in the capacitor contact holes, such that the capacitor contact holes penetrate through the capping dielectric layer to expose the active areas.

9. The manufacturing method of a semiconductor structure according to claim 7, wherein a plurality of parallel spaced embedded gate word lines are formed in the substrate, and an extension direction of the embedded gate word lines is intersected with an extension direction of the bit lines and an extension direction of the active areas.

10. A semiconductor structure, comprising:
a substrate, the substrate being provided with spaced active areas therein and a plurality of parallel spaced bit lines thereon;
a filling dielectric layer, located between adjacent bit lines; and
capacitor contact structures, located in the filling dielectric layer, the capacitor contact structures each comprising a first sub-contact-structure and a second sub-contact-structure, and the first sub-contact-structure and the second sub-contact-structure being located on two opposite sides of each of the bit lines;
wherein upper surfaces of the capacitor contact structures are lower than upper surfaces of the bit lines.

11. The semiconductor structure according to claim 10, wherein there are a plurality of the capacitor contact structures that are arranged in rows and columns, and the capacitor contact structures in the adjacent columns are staggered.

12. The semiconductor structure according to claim 10, wherein the first sub-contact-structure and the second sub-contact-structure are of a half-moon shape.

13. The semiconductor structure according to claim 10, further comprising: shallow trench isolation structures; wherein the shallow trench isolation structures isolate, in the substrate, the active areas arranged in an array; and bottoms of the capacitor contact structures are in contact with the active areas.

14. The semiconductor structure according to claim 13, wherein a plurality of parallel spaced embedded gate word lines are further formed in the substrate, and an extension direction of the embedded gate word lines is intersected with an extension direction of the bit lines and an extension direction of the active areas.

15. The semiconductor structure according to claim 14, wherein the bit lines extend along a column direction, the embedded gate word lines extend along a row direction, and the active areas each extends along a direction forming a preset included angle with each of the bit lines.

* * * * *